United States Patent
Hatakeyama

(10) Patent No.: US 9,658,532 B2
(45) Date of Patent: May 23, 2017

(54) PATTERN FORMING PROCESS

(71) Applicant: SHIN-ETSU CHEMICAL CO., LTD., Tokyo (JP)

(72) Inventor: Jun Hatakeyama, Joetsu (JP)

(73) Assignee: SHIN-ETSU CHEMICAL CO., LTD. (JP)

( * ) Notice: Subject to any disclaimer, the term of this patent is extended or adjusted under 35 U.S.C. 154(b) by 0 days.

(21) Appl. No.: 15/203,028

(22) Filed: Jul. 6, 2016

(65) Prior Publication Data

US 2017/0010537 A1 Jan. 12, 2017

(30) Foreign Application Priority Data

Jul. 8, 2015 (JP) .................................. 2015-136629

(51) Int. Cl.

| | | |
|---|---|---|
| *G06F 7/40* | (2006.01) | |
| *G03F 7/38* | (2006.01) | |
| *G03F 7/16* | (2006.01) | |
| *G03F 7/20* | (2006.01) | |
| *G03F 7/32* | (2006.01) | |
| *G03F 7/40* | (2006.01) | |
| *C08F 220/26* | (2006.01) | |
| *C08F 220/24* | (2006.01) | |
| *C08F 220/22* | (2006.01) | |
| *C08F 220/38* | (2006.01) | |
| *B05D 1/00* | (2006.01) | |
| *B05D 3/04* | (2006.01) | |
| *H01L 33/16* | (2010.01) | |

(52) U.S. Cl.
CPC ............... *G03F 7/38* (2013.01); *B05D 1/005* (2013.01); *B05D 3/0453* (2013.01); *C08F 220/22* (2013.01); *C08F 220/24* (2013.01); *C08F 220/26* (2013.01); *C08F 220/38* (2013.01); *G03F 7/168* (2013.01); *G03F 7/2041* (2013.01); *G03F 7/2053* (2013.01); *G03F 7/325* (2013.01); *G03F 7/40* (2013.01); *H01L 33/16* (2013.01)

(58) Field of Classification Search
CPC .......... G03F 7/004; G03F 7/11; G03F 7/2041; G03F 7/26; G03F 7/32; G03F 7/40; C08F 220/38; C08F 220/26; C08F 220/22; C08F 220/24; H01L 33/16; H01L 2205/025; B05D 1/005; B05D 3/007; B05D 3/0453
USPC ...... 430/270.1, 271.1, 273.1, 322, 325, 329, 430/330, 331; 526/242.319
See application file for complete search history.

(56) References Cited

U.S. PATENT DOCUMENTS

| | | | | |
|---|---|---|---|---|
| 4,900,696 A * | 2/1990 | Ito | ............................ | G03F 7/265 148/DIG. 137 |
| 5,229,244 A * | 7/1993 | Hertler | ....................... | G03F 7/28 430/144 |
| 6,002,108 A * | 12/1999 | Yoshioka | ................... | G03F 7/38 219/388 |
| 6,261,744 B1 * | 7/2001 | Yoshioka | ................... | G03F 7/38 430/325 |
| 6,844,027 B1 * | 1/2005 | Gurer | ....................... | G03F 7/168 118/320 |
| 6,953,268 B2 * | 10/2005 | Kimura | ................ | G03F 7/70275 348/E5.139 |
| 7,233,029 B2 * | 6/2007 | Mochizuki | ............ | G02B 5/0825 257/98 |
| 8,129,093 B2 * | 3/2012 | Yin | ............................ | G03F 7/11 430/313 |
| 2002/0042017 A1 * | 4/2002 | Hatakeyama | .......... | G03F 7/0045 430/270.1 |
| 2003/0066549 A1 * | 4/2003 | Noda | ......................... | B08B 7/00 134/37 |
| 2007/0212801 A1 * | 9/2007 | Kanno | ................ | G03F 7/70616 438/14 |
| 2010/0203299 A1 * | 8/2010 | Abdallah | ................... | G03F 7/40 428/195.1 |
| 2012/0003436 A1 * | 1/2012 | Saie | ....................... | G03F 7/0007 428/195.1 |

FOREIGN PATENT DOCUMENTS

| | | | |
|---|---|---|---|
| JP | 05072747 A | * | 3/1993 |
| JP | 9-43855 A | | 2/1997 |
| JP | 9-320930 A | | 12/1997 |
| JP | 2994501 B2 | | 12/1999 |

OTHER PUBLICATIONS

Machine translation of JP 05-72747 (no date).*
Truffert et al., "Ultimate contact hole resolution using immersion lithography with line/space imaging"., Proc. of SPIE, vol. 7274, pp. 72740N-1-72740N-12 (2009).
Fang et al., "A Physics-based Model for Negative Tone Development Materials"., Journal of Photopolymer Science and Technology, vol. 27, No. 1, pp. 53-59 (2014).

* cited by examiner

*Primary Examiner* — Amanda C Walke
(74) *Attorney, Agent, or Firm* — Westerman, Hattori, Daniels & Adrian, LLP

(57) ABSTRACT

A negative tone pattern is formed by coating a resist composition onto a substrate, prebaking to form a resist film, exposing the resist film to high-energy radiation, PEB the resist film in a high-humidity environment, and developing the resist film in an organic solvent developer. PEB in a high-humidity environment is effective for reducing the shrinkage of the resist film during the step and thus preventing the trench pattern from deformation.

10 Claims, No Drawings

PATTERN FORMING PROCESS

CROSS-REFERENCE TO RELATED APPLICATION

This non-provisional application claims priority under 35 U.S.C. §119(a) on Patent Application No. 2015-136629 filed in Japan on Jul. 8, 2015, the entire contents of which are hereby incorporated by reference.

FIELD OF INVENTION

This invention relates to a pattern forming process.

BACKGROUND ART

To meet the demand for higher integration density and operating speed of LSIs, the effort to reduce the pattern rule is in rapid progress. At the present, the manufacture of 20 nm node logic devices by a double patterning version of ArF immersion lithography is implemented in a mass scale. The manufacture of 14 nm node logic devices is approaching to a mass level. The ArF lithography was adopted on 65-nm node and applied to 45 nm node owing to the immersion lithography combined with a projection lens having NA in excess of 1. The double patterning technology is adopted from 32 nm node, and the mass scale manufacture of 22 nm and 14 nm node devices is implemented by this technology. The manufacture of 10 nm and 7 nm node devices by repeating double patterning twice is under study.

In reducing a line-and-space pattern, the double patterning technology using a sidewall spacer wherein a film of $SiO_2$ or the like is formed on both sidewalls of a pattern feature by CVD is adopted. With this technology, from a resist pattern with a half pitch of 40 nm after development, lines can be formed at a half pitch of 20 nm. It is theoretically possible to form lines at a half pitch of 10 nm by repeating the sidewall spacer process twice. On the other hand, it is known prior to the adoption of the double patterning technology that the use of negative tone image in contact hole pattern formation is superior. In the critical dimension photolithography of forming an image by utilizing the optical interference of a mask pattern, black spots in principle provide a higher image contrast than white spots. The formation of a hole pattern via negative imaging using a bright mask pattern rather than a dark mask pattern combined with positive tone resist allows for use of higher contrast light. These lead to merits such as smaller critical dimension (CD) and better CD uniformity.

The negative tone resist of conventional alkaline development type is based on a crosslinking system. A problem arises that the resist swells in the developer as a result of crosslinking whereby CD uniformity is impaired. There is a need to search for a new negative imaging technique as a replacement of the conventional crosslinking system.

Non-Patent Document 1 reports hole pattern formation via image reversal by the three methods. Included are a hole forming method (1) of using a positive tone resist composition, forming a dot pattern by two exposures of double dipole of X and Y lines, forming a $SiO_2$ film thereon by LPCVD, and reversing the dots to holes by $O_2$-RIE, a hole forming method (2) of forming a dot pattern by the same method as above, but using a resist material adapted to turn alkali soluble and solvent insoluble on heating, coating a phenol-based overcoat film thereon, and effecting image reversal by alkaline development, thus forming a hole pattern, and a hole forming method (3) of subjecting a positive tone resist to double dipole exposures, and effecting image reversal by organic solvent development, thus forming a hole pattern.

The organic solvent development to form a negative pattern is a traditional technique. A resist composition comprising cyclized rubber is developed using an alkene such as xylene as the developer. An early chemically amplified resist composition comprising poly(t-butoxycarbonyloxystyrene) is developed with anisole as the developer to form a negative pattern. Under such background, a highlight is again put on the organic solvent development capable of forming negative tone images.

When an isolated trench pattern is formed by negative tone development, deformation of the pattern is a problem (Non-Patent Document 2). Since the film surface of an isolated trench is widely opened, a trench pattern of tapered shape is formed. The pattern of tapered shape is undesirable because it can cause a dimensional shift during dry etching following development. When an isolated trench pattern is formed by alkaline development of a positive tone resist, such pattern deformation does not occur. When an isolated line pattern is formed by alkaline development of a positive tone resist, such pattern deformation does not occur although the situation immediately before development is the same as in the case of formation of an isolated trench pattern by organic solvent development.

Because of deprotection reaction during post-exposure bake (PEB) and evaporation of an olefin compound resulting from deprotection from the resist film, the resist film in the exposed region is shrunk. In the case of positive tone pattern formation by alkaline development, a portion of the resist film where no deprotection takes place, that is, unshrunk film is left after development. In contrast, in the case of negative tone pattern formation by organic solvent development, the shrunk film is left after development. Since the shrunk film is deformed due to internal stress applied, the pattern after development is also deformed.

Patent Document 1 discloses a chemically amplified negative tone resist material of crosslinking type and a process involving PEB in a high-humidity atmosphere. The process is effective for suppressing generation of defects bridging between lines. With respect to chemically amplified positive tone resist material, Patent Document 2 describes that PEB in a low-humidity atmosphere is better in CD uniformity. In the case of positive tone resist material based on a polymer having an acetal protective group, deprotection reaction does not take place during PEB in a low-humidity environment. Thus PEB in a moderate humidity environment is preferred. Patent Document 3 proposes a system for performing PEB under control of humidity.

CITATION LIST

Patent Document 1: JP 2994501
Patent Document 2: JP-A H09-043855
Patent Document 3: JP-A H09-320930
Non-Patent Document 1: Proc. SPIE, Vol. 7274, p. 72740N (2009)
Non-Patent Document 2: Journal of Photopolymer Science and Technology, Vol. 27, No. 1, p. 53 (2014)

SUMMARY OF INVENTION

As discussed above, the deprotection of acid labile groups on the base resin during PEB causes shrinkage of the resist film in the exposed region, which eventually leads to deformation of a resist pattern after organic solvent development, especially spreading of an isolated trench pattern at the top. The shrinkage of the resist film during PEB must be reduced in order to prevent the pattern from deformation.

An object of the invention is to provide a process for forming a negative tone pattern in a resist film via organic solvent development, capable of reducing the shrinkage of the resist film during PEB for thereby preventing a trench pattern after development from deformation.

The inventor has found that when a negative tone pattern is formed by exposing a resist film of a resist composition comprising a base resin comprising recurring units having an acid labile group-substituted carboxyl group and an organic solvent, post-exposure baking (PEB) in a high-humidity environment, and developing in an organic solvent developer, the shrinkage of the exposed resist film is reduced and as a result, an isolated pattern after development is prevented from deformation.

In one aspect, the invention provides a pattern forming process comprising the steps of:
coating a resist composition comprising a base resin comprising recurring units having an acid labile group-substituted carboxyl group and an organic solvent onto a substrate,
prebaking the composition to form a resist film,
exposing the resist film to high-energy radiation,
post-exposure baking the resist film in a high-humidity environment having a water content of at least 10 g per kilogram of dry air, and
developing the resist film in an organic solvent developer to form a negative pattern.

Preferably, the PEB step includes heating on a hot plate.
Also preferably, the PEB step includes spraying hot humid steam.

In a preferred embodiment, the recurring units having an acid labile group-substituted carboxyl group have the formula (1).

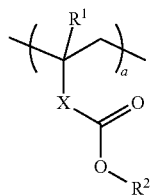

Herein $R^1$ is hydrogen or methyl, $R^2$ is an acid labile group of tertiary alkyl type, X is a single bond or —C(=O)—O—$R^3$—, $R^3$ is a straight, branched or cyclic alkylene group which may contain an ether or ester bond, or phenylene or naphthylene group, and a is a positive number in the range: $0 < a \leq 1.0$.

The resist composition may further comprise an acid generator.

Typically, the resist film has a thickness of 10 to 1,000 nm.

In a preferred embodiment, a film thickness loss between the thickness of the resist film prior to the PEB step and the thickness of the resist film after the PEB step is less than 15% of the thickness of the resist film prior to the PEB step.

Preferably, the developer comprises at least one organic solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Preferably, the exposing step includes lithography using KrF excimer laser of wavelength 248 nm, ArF excimer laser of wavelength 193 nm, EUV of wavelength 13.5 nm or EB. More preferably, the exposing step is performed by immersion lithography, with a liquid having a refractive index of at least 1 being interposed between the resist film and a projection lens.

ADVANTAGEOUS EFFECTS OF INVENTION

The pattern forming process of the invention is successful in reducing the shrinkage of a resist film during PEB for thereby preventing an isolated trench pattern from deformation.

DESCRIPTION OF PREFERRED EMBODIMENTS

The terms "a" and "an" herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. In the chemical formulae, Me stands for methyl and Ac for acetyl.

The abbreviations and acronyms have the following meaning.
EUV: extreme ultraviolet radiation
EB: electron beam
Mw: weight average molecular weight
Mn: number average molecular weight
Mw/Mn: molecular weight distribution or dispersity
GPC: gel permeation chromatography
PEB: post-exposure bake
PAG: photoacid generator The pattern forming process is defined as comprising the steps of coating a resist composition comprising a base resin comprising recurring units having an acid labile group-substituted carboxyl group and an organic solvent onto a substrate, prebaking the composition to form a resist film, exposing the resist film to high-energy radiation, PEB the resist film in a high-humidity environment having a water content of at least 10 g per kilogram of dry air, and developing the resist film in an organic solvent developer to form a negative pattern.

The high-humidity environment is defined as an environment having a water content of at least 10 g per kilogram of dry air. In the presence of strong acid, water takes the form of $H_3O^+$, which adds to an olefin created by deprotection reaction to form an alcohol. Because of its high boiling point, the alcohol is unlikely to evaporate off the resist film. As a result, shrinkage of the resist film is reduced. Since the alcohol is less soluble in the organic solvent developer, the retention of the resist film after development is increased.

The resist composition is based on a base resin comprising recurring units having a carboxyl group substituted with an acid labile group, preferably recurring units having the formula (1), which are also referred to as recurring units (a).

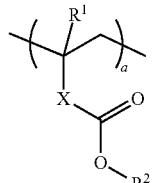
(1)

Herein $R^1$ is hydrogen or methyl, $R^2$ is an acid labile group of tertiary alkyl type, X is a single bond or —C(=O)—O—$R^3$—, $R^3$ is a straight, branched or cyclic $C_1$-$C_{10}$ alkylene group which may contain an ether or ester bond, or phenylene or naphthylene group, and a is a positive number in the range: $0 < a \le 1.0$.

The recurring units (a) are derived from monomers having the formula (Ma).

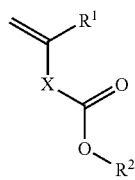
(Ma)

Herein $R^1$, $R^2$ and X are as defined above.

Examples of the monomer having formula (Ma) wherein X is a variant are shown below, but not limited thereto. $R^1$ and $R^2$ are as defined above.

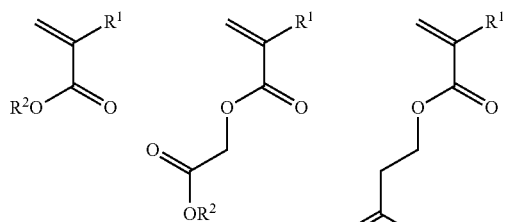

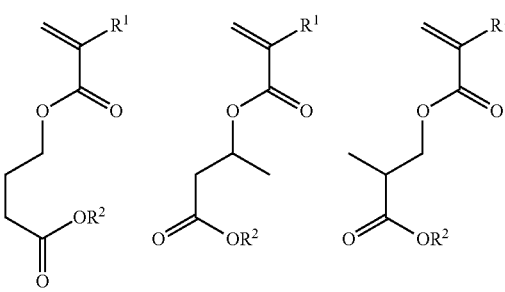

-continued

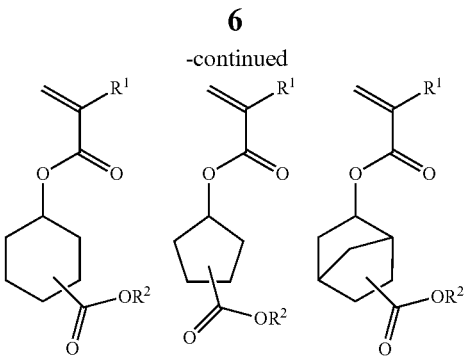

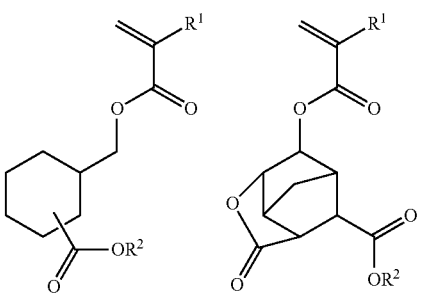

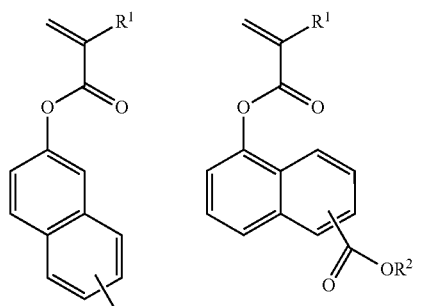

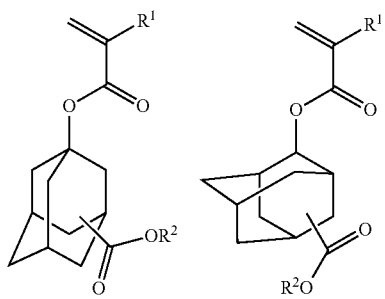

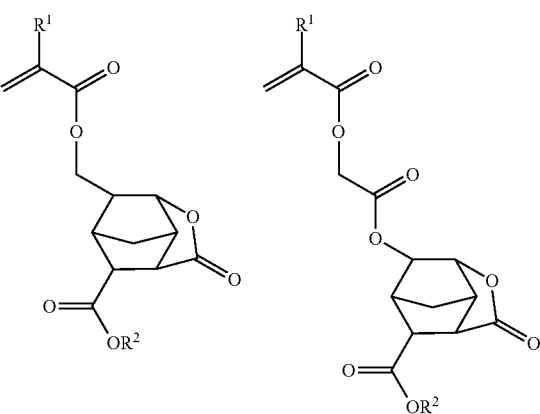

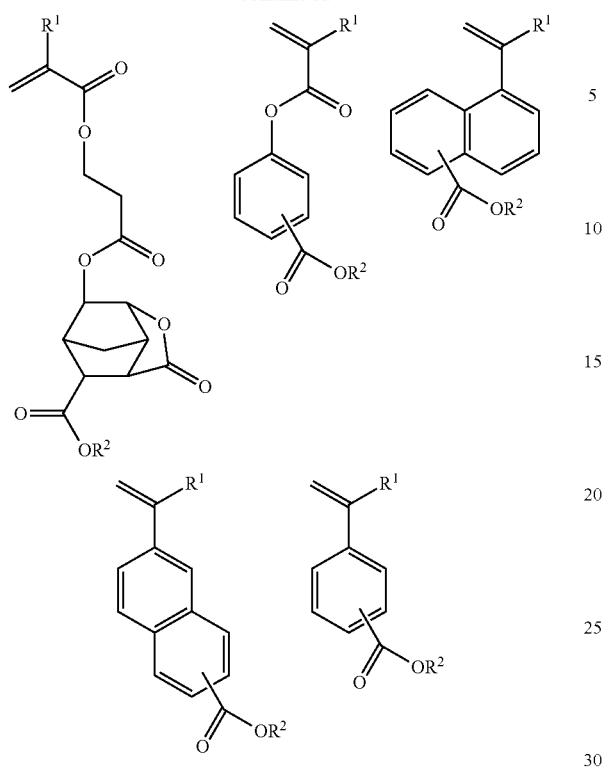

In formula (1), $R^2$ is an acid labile group of tertiary alkyl type, which is typically a tertiary alkyl group having the formula (AL-1).

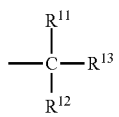

(AL-1)

In formula (AL-1), $R^{11}$, $R^{12}$ and $R^{13}$ are each independently a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{11}$ and $R^{12}$, $R^{11}$ and $R^{13}$, or $R^{12}$ and $R^{13}$, taken together, may form an aliphatic ring of 3 to 20 carbon atoms with the carbon atom to which they are attached.

Examples of the tertiary alkyl group having formula (AL-1) include t-butyl, triethylcarbyl, 1-ethylnorbornyl, 1-methylcyclohexyl, 1-ethylcyclopentyl, t-pentyl, and groups having the following formulae (AL-1)-1 to (AL-1)-16.

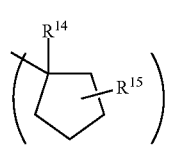

(AL-1)-1

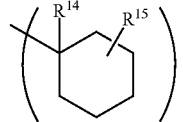

(AL-1)-2

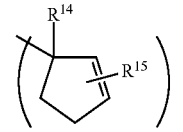

(AL-1)-3

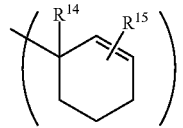

(AL-1)-4

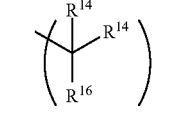

(AL-1)-5

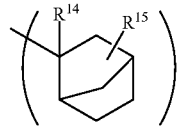

(AL-1)-6

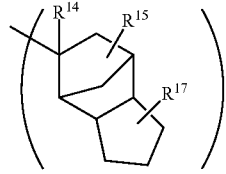

(AL-1)-7

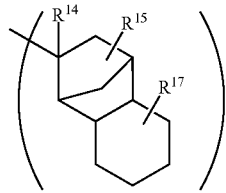

(AL-1)-8

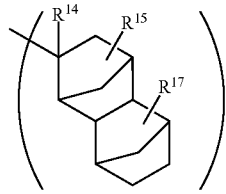

(AL-1)-9

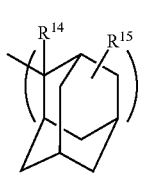

(AL-1)-10

-continued (AL-1)-11
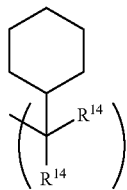

(AL-1)-12
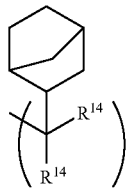

(AL-1)-13
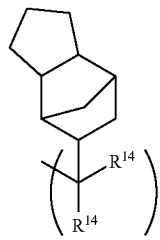

(AL-1)-14
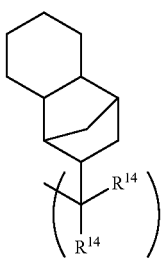

(AL-1)-15
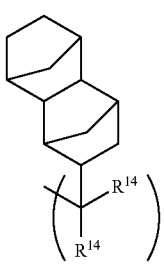

(AL-1)-16
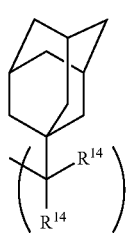

Herein $R^{14}$ is each independently a straight, branched or cyclic $C_1$-$C_8$ alkyl group, $C_6$-$C_{20}$ aryl group or $C_7$-$C_{20}$ aralkyl group, two or more of groups $R^{14}$ may bond together to form a ring. $R^{15}$ and $R^{17}$ are each independently hydrogen, methyl or ethyl. $R^{16}$ is a $C_6$-$C_{20}$ aryl group or $C_7$-$C_{20}$ aralkyl group.

Also included are acid labile groups having the following formula (AL-1)-17. The base resin may be crosslinked within the molecule or between molecules with an acid labile group of formula (AL-1)-17.

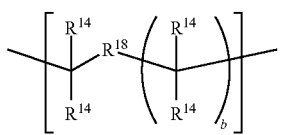
(AL-1)-17

Herein $R^{14}$ is as defined above, $R^{18}$ is a single bond, a straight, branched or cyclic $C_1$-$C_{20}$, di to tetravalent, aliphatic hydrocarbon group, or $C_6$-$C_{20}$, di to tetravalent, aromatic hydrocarbon group, which may contain a heteroatom such as oxygen, sulfur or nitrogen, and b is an integer of 0 to 3.

It is noted that groups $R^{14}$, $R^{15}$, $R^{16}$ and $R^{17}$ may contain a heteroatom such as oxygen, nitrogen or sulfur. Such groups are exemplified by those of the following formulae (AL-2)-1 to (AL-2)-7.

—(CH$_2$)$_4$OH (AL-2)-1

—(CH$_2$)$_2$O(CH$_2$)$_3$CH$_3$ (AL-2)-2

 (AL-2)-3

—(CH$_2$)$_2$O(CH$_2$)$_2$OH (AL-2)-4

—(CH$_2$)$_6$OH (AL-2)-5

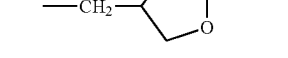 (AL-2)-6

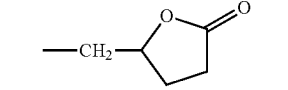 (AL-2)-7

Of the acid labile groups having formula (AL-1), groups of exo-form structure having the formula (AL-1)-18 are preferred.

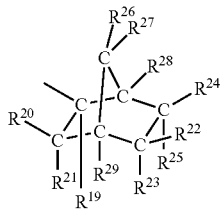
(AL-1)-18

Herein $R^{19}$ is a straight, branched or cyclic $C_1$-$C_8$ alkyl group or an optionally substituted $C_6$-$C_{20}$ aryl group; $R^{20}$ to $R^{25}$, $R^{28}$ and $R^{29}$ are each independently hydrogen or a monovalent hydrocarbon group, typically straight, branched or cyclic alkyl, of 1 to 15 carbon atoms which may contain a heteroatom; and $R^{26}$ and $R^{27}$ are hydrogen. Alternatively, a pair of $R^{20}$ and $R^{21}$, $R^{22}$ and $R^{24}$, $R^{22}$ and $R^{25}$, $R^{23}$ and $R^{25}$, $R^{23}$ and $R^{29}$, $R^{24}$ and $R^{28}$, $R^{26}$ and $R^{27}$, or $R^{27}$ and $R^{28}$ may bond together to form a ring, typically alicyclic, with the carbon atom to which they are attached, and in this case, the ring forming moiety is a divalent hydrocarbon group, typically straight, branched or cyclic alkylene, of 1 to 15 carbon atoms which may contain a heteroatom. Also, a pair of $R^{20}$ and $R^{29}$, $R^{26}$ and $R^{29}$, or $R^{22}$ and $R^{24}$ which are attached to vicinal carbon atoms may bond together directly to form a double bond. The formula also represents an enantiomer.

Suitable recurring units having the exo-form structure of formula (AL-1)-18 include those of the following formula.

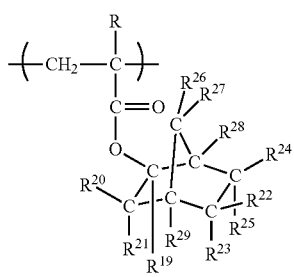

Herein $R^{19}$ to $R^{29}$ are as defined above, and R is hydrogen or methyl.

The monomers from which the recurring units having the exo-form structure are derived are described, for example, in U.S. Pat. No. 6,448,420 (JP-A 2000-327633). Examples of the monomers are shown below, but not limited thereto.

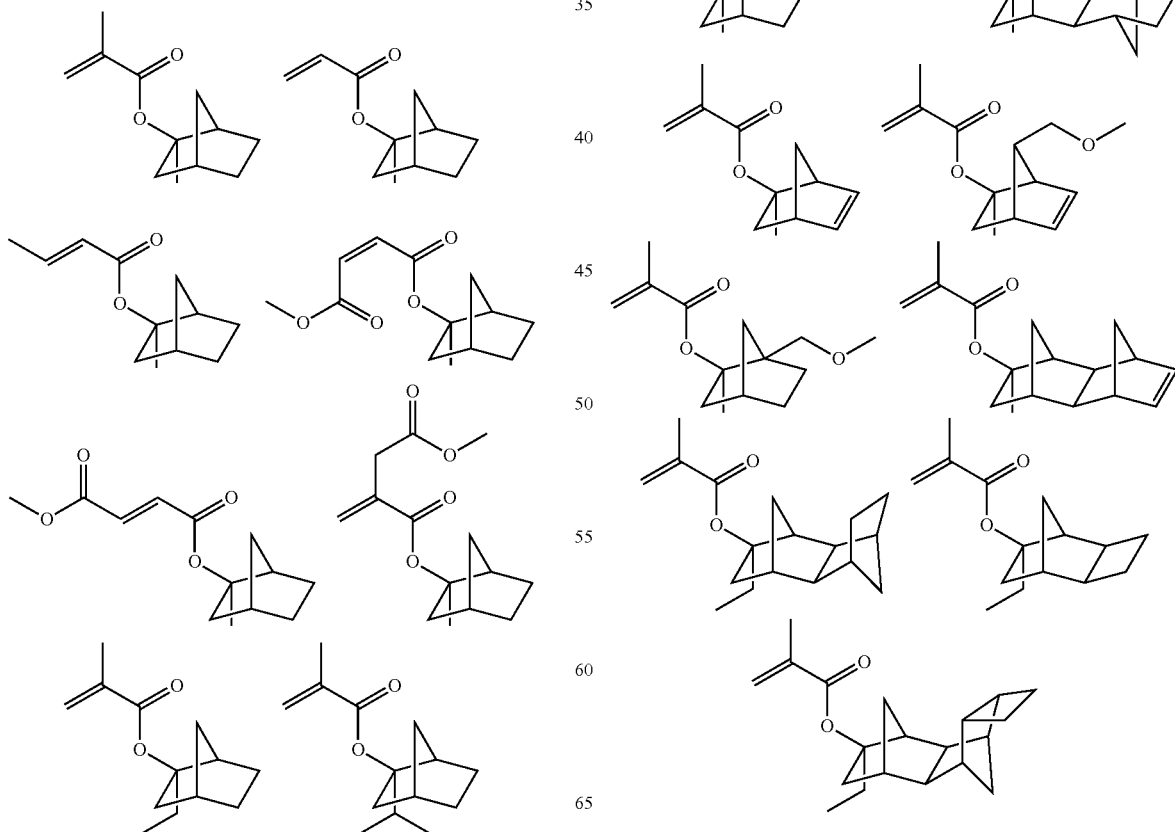

-continued

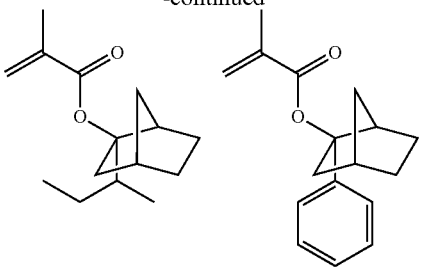
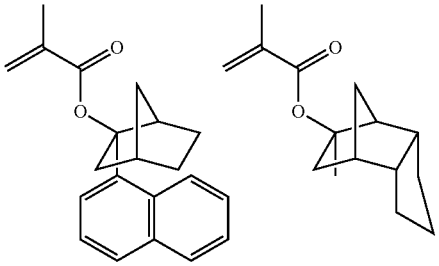
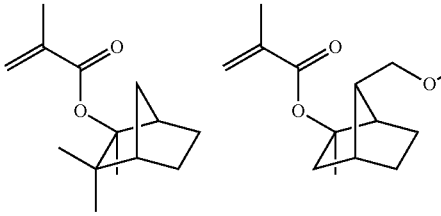
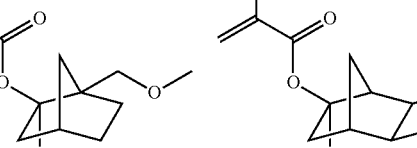
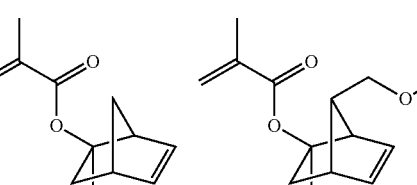
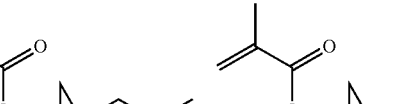
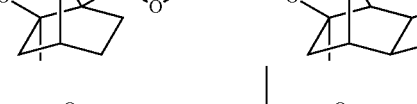
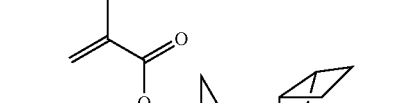
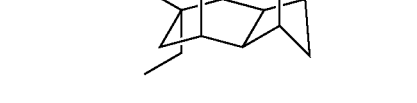

Also included in the acid labile groups of formula (AL-1) are acid labile groups having furandiyl, tetrahydrofurandiyl or oxanorbornanediyl as represented by the following formula (AL-1)-19.

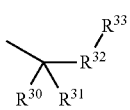

(AL-1)-19

Herein, $R^{30}$ and $R^{31}$ are each independently a $C_1$-$C_{10}$ monovalent hydrocarbon group, and $R^{30}$ and $R^{31}$, taken together, may form an aliphatic hydrocarbon ring of 3 to 20 carbon atoms with the carbon atom to which they are attached. $R^{32}$ is furandiyl, tetrahydrofurandiyl or oxanorbornanediyl. $R^{33}$ is hydrogen or a $C_1$-$C_{10}$ monovalent hydrocarbon group which may contain a heteroatom. Typical monovalent hydrocarbon groups are straight, branched or cyclic alkyl groups.

Suitable recurring units having an acid labile group of formula (AL-1)-19 include those having the following formula.

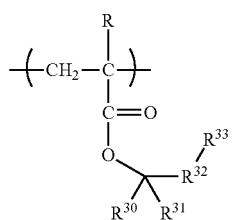

Herein R and $R^{30}$ to $R^{33}$ are as defined above.

Examples of the monomer from which these recurring units are shown below.

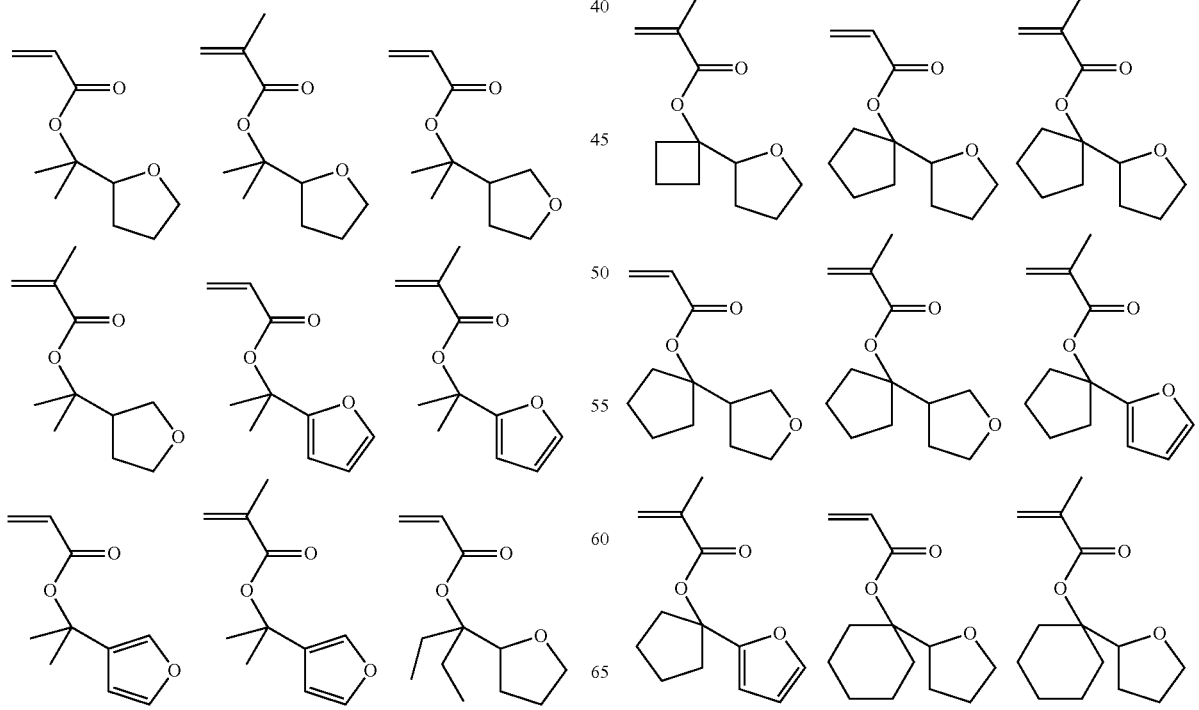

-continued

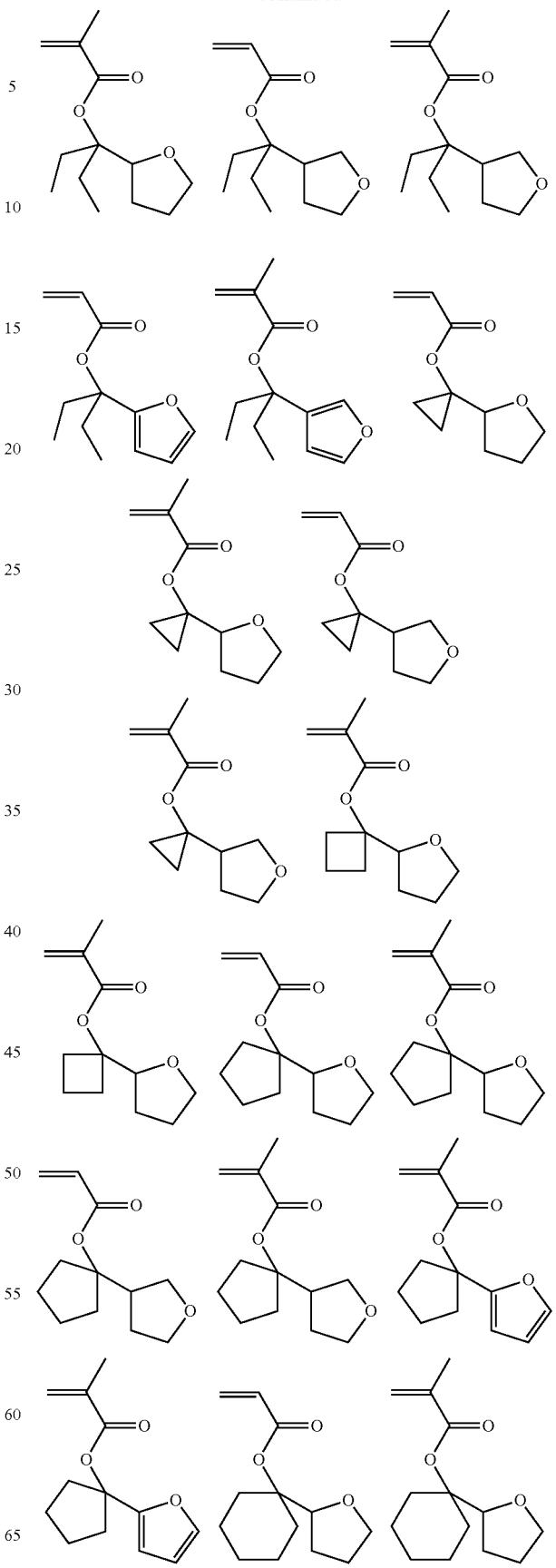

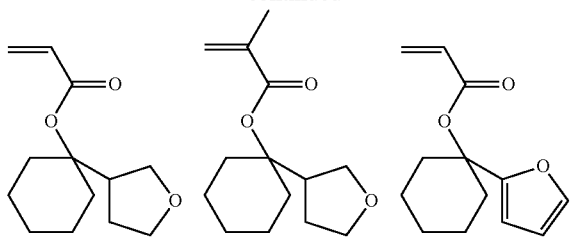
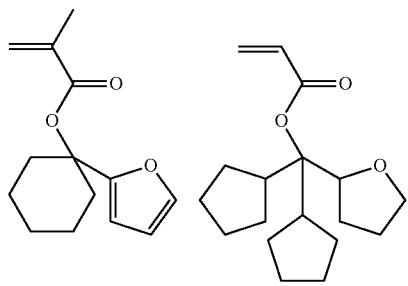
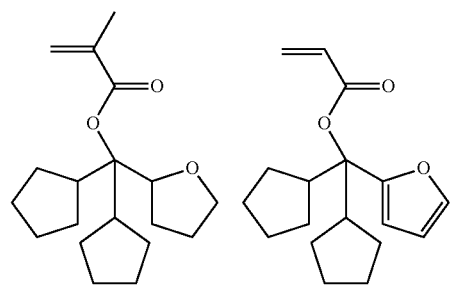
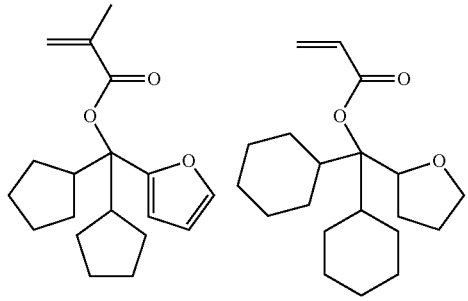
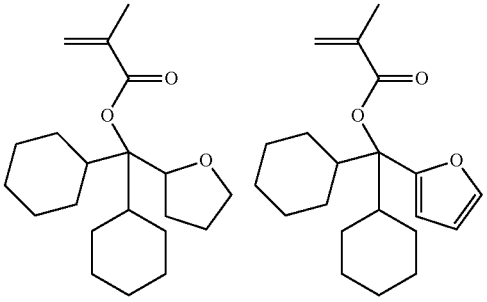
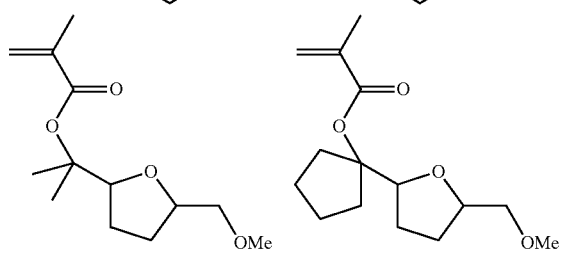
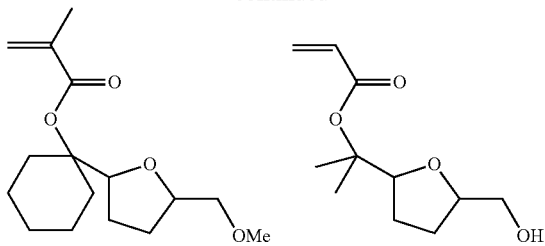
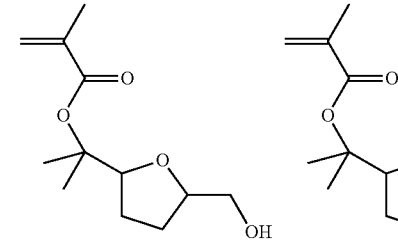
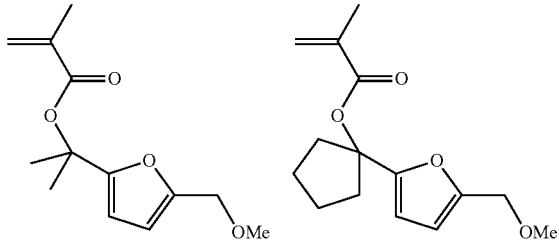
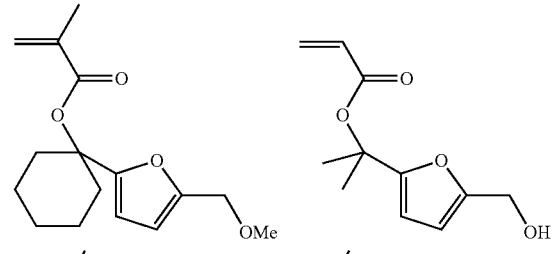
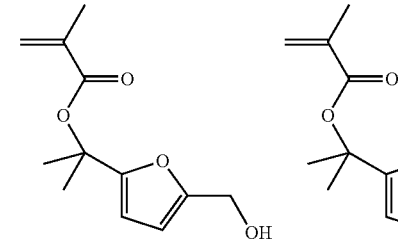
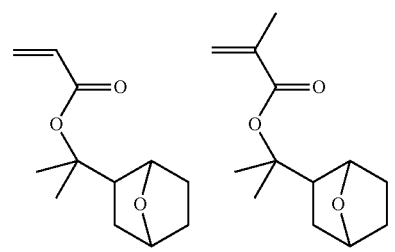
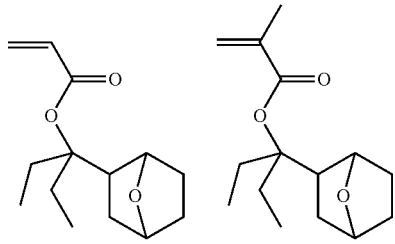

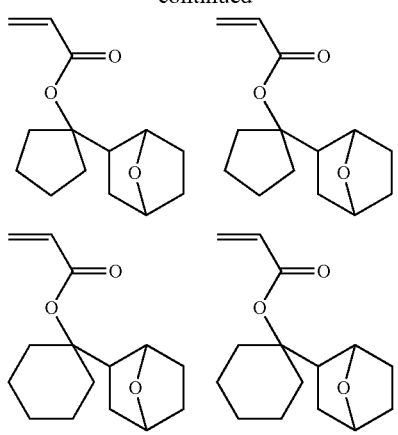
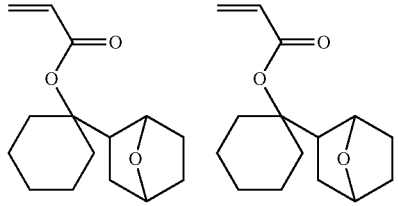
Of the tertiary alkyl groups of formula (AL-1), those groups having a branched alkyl group directly attached to a ring offer high solubility in organic solvent. Suitable acid labile groups are shown below, but not limited thereto. In the following formulae, the line segment protruding out of the bracket denotes a valence bond.
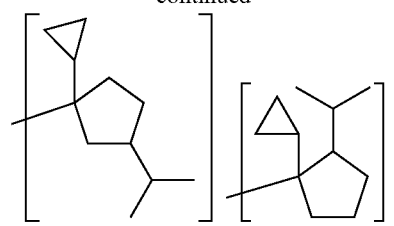
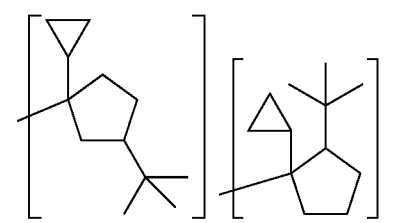
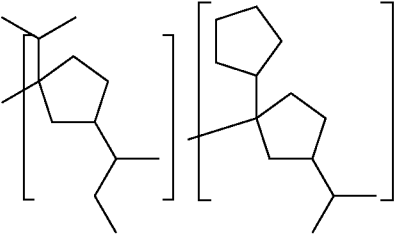
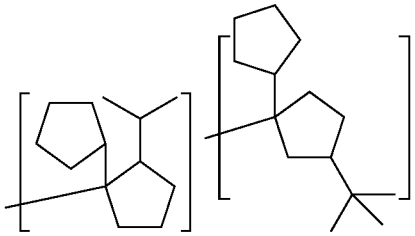
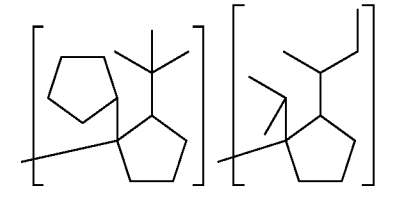
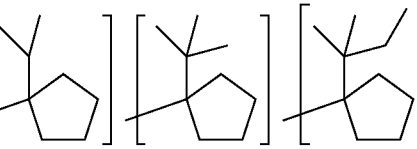
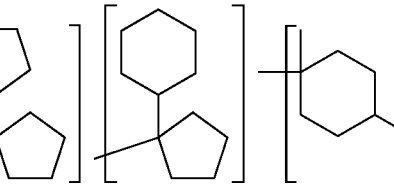
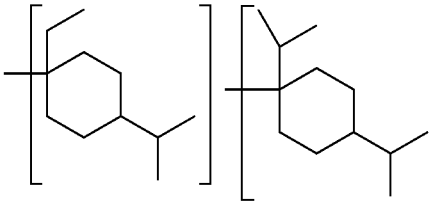

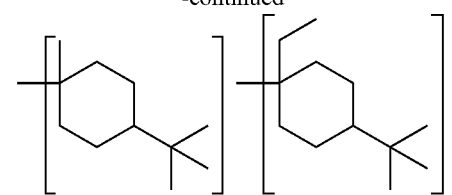
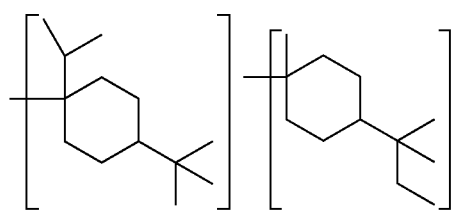
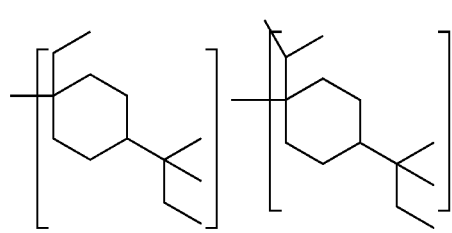
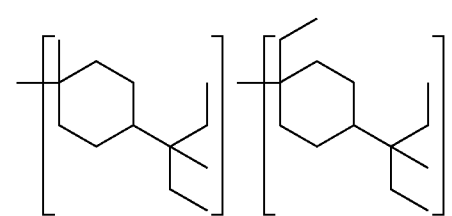
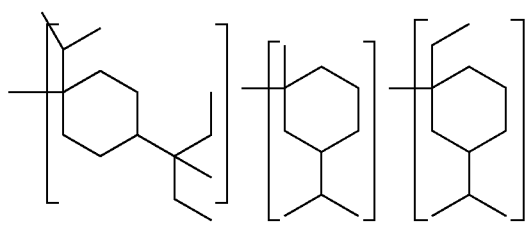
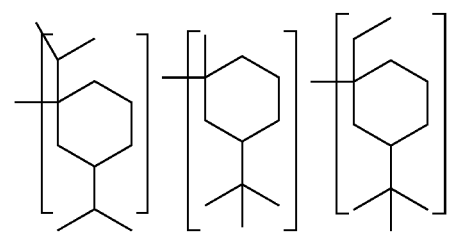
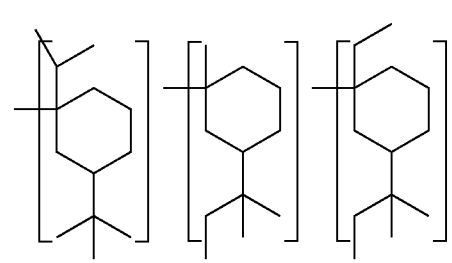

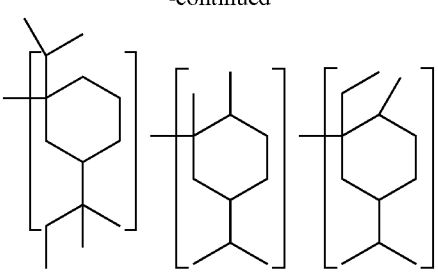
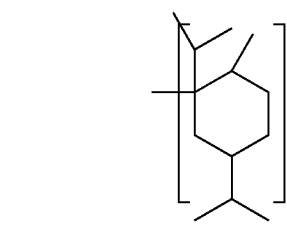

In a preferred embodiment, the base resin may further comprise recurring units (b) having a group selected from among hydroxyl, carboxyl, lactone ring, lactam ring, sultone ring, sulfone, sulfonic acid ester, sulfonamide, carboxylic acid amide, nitro, cyano, thienyl, furyl, pyrrole, acid anhydride, imide, —NH—(C=O)—O—, —S—(C=O)—O—, and —O—NO$_2$. Inclusion of recurring units (b) is effective for improving the insolubilization of the exposed region of resist film in organic solvent developer and the adhesion of resist film to the substrate and hence, preventing pattern collapse.

Examples of the monomer from which recurring units (b) are derived are shown below, but not limited thereto.

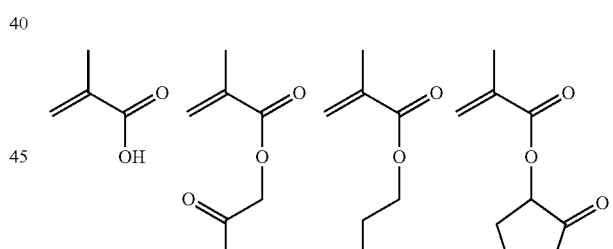
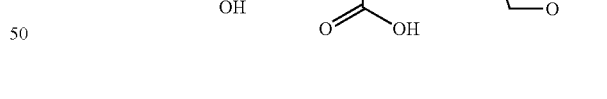
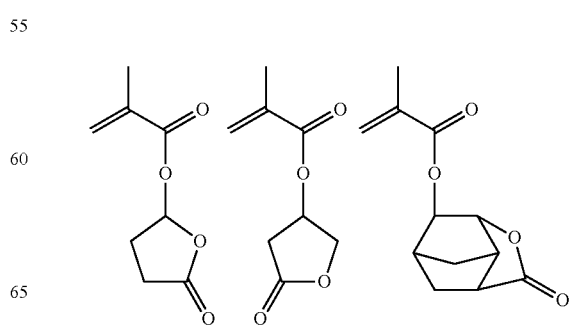

21
-continued
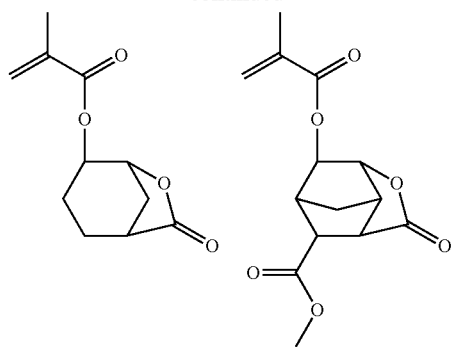
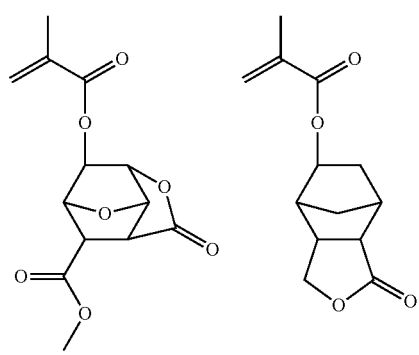
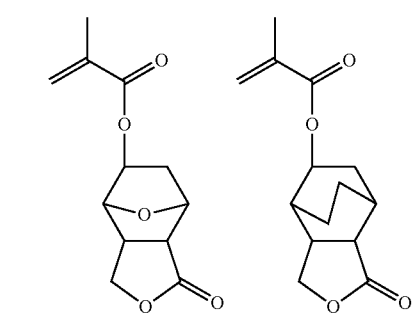
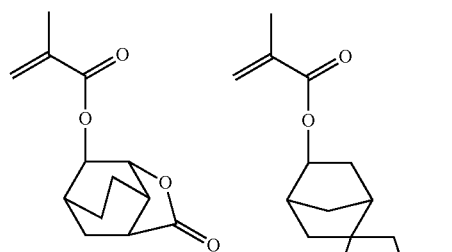
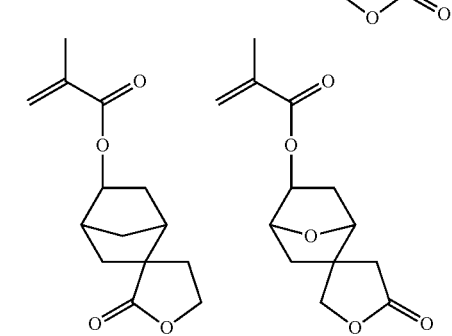
22
-continued
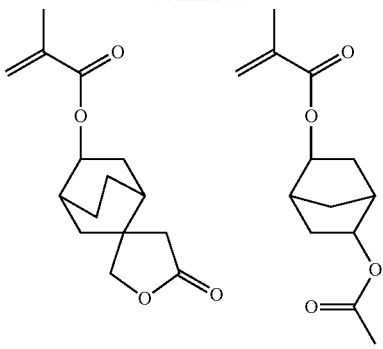
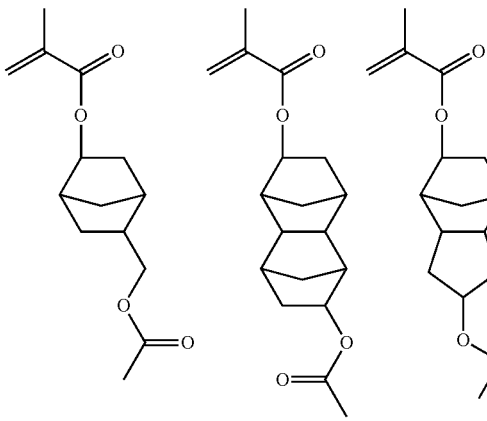
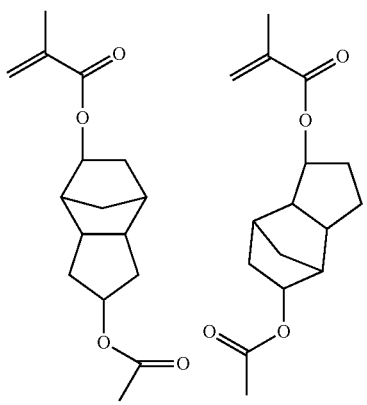
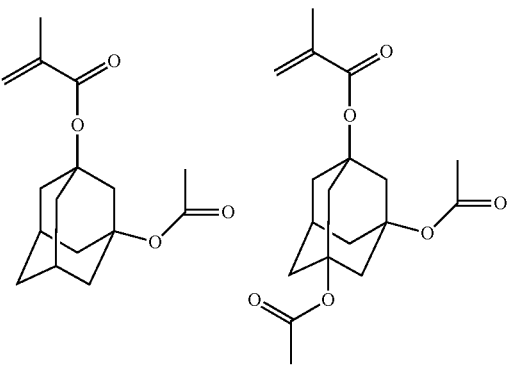

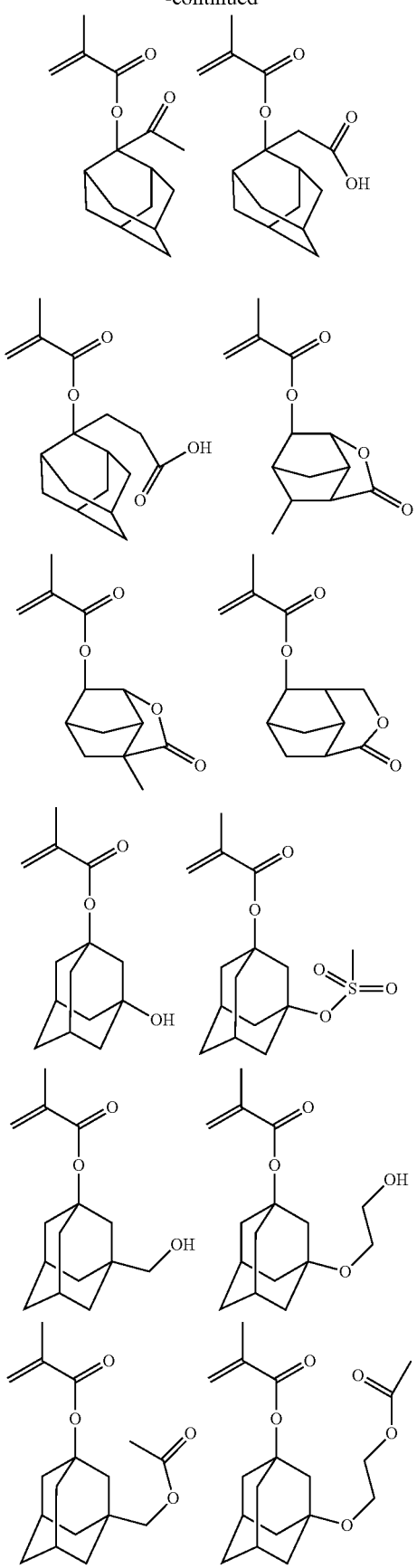
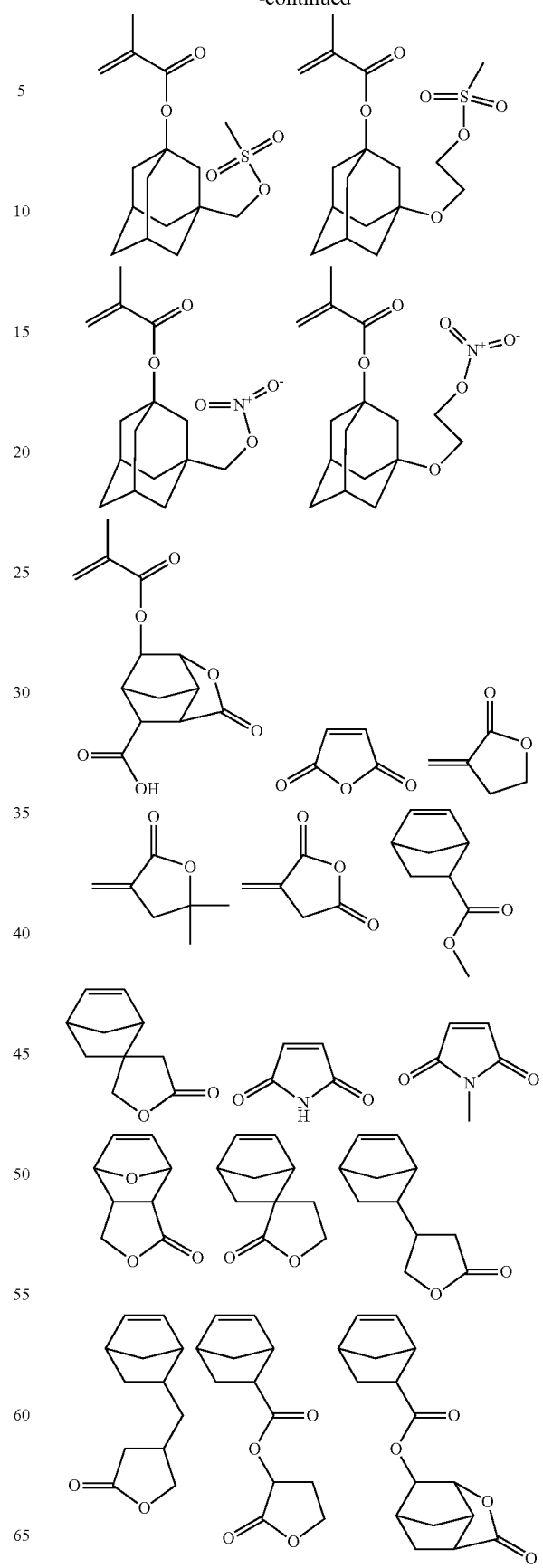

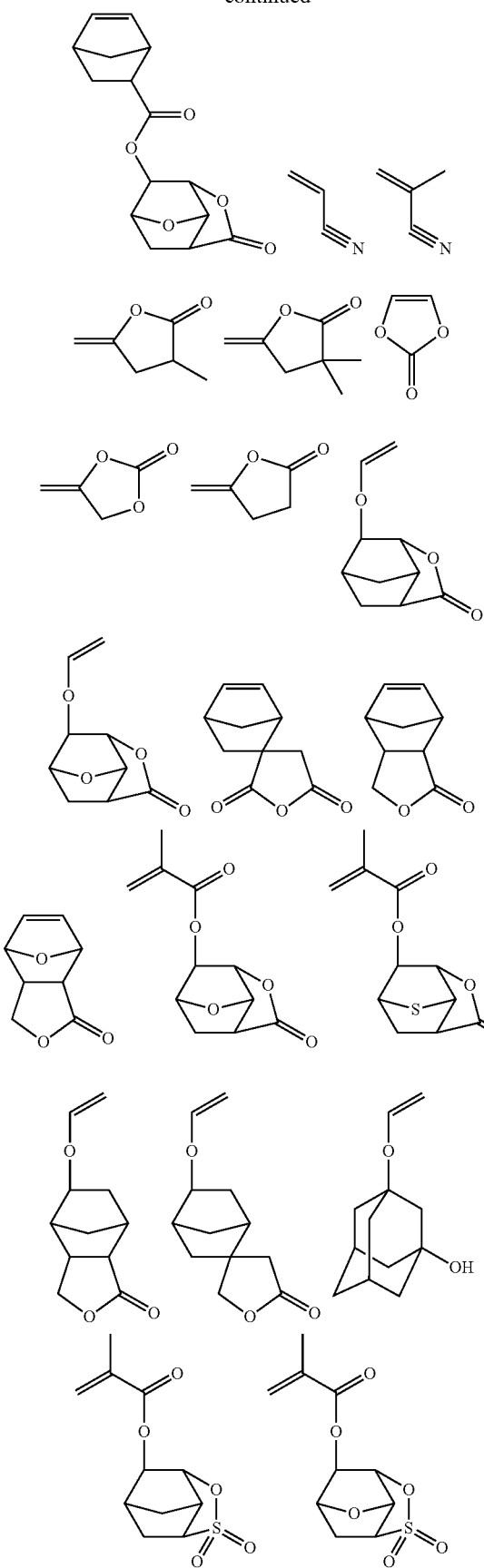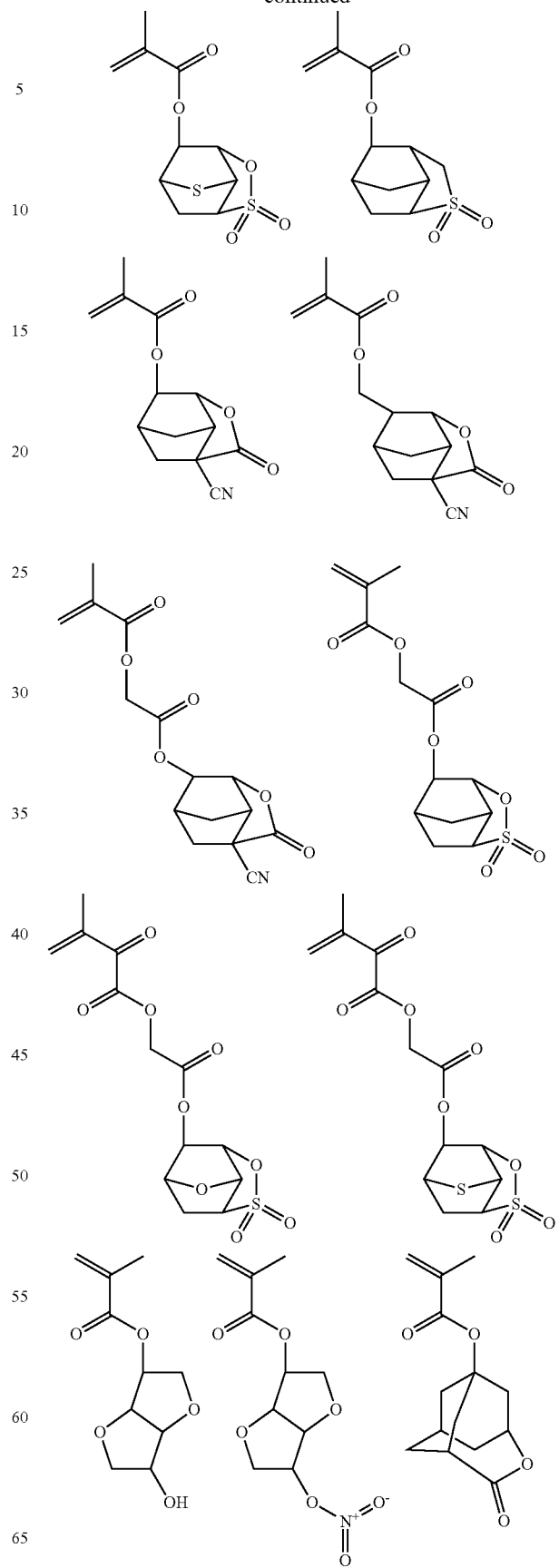

27
-continued
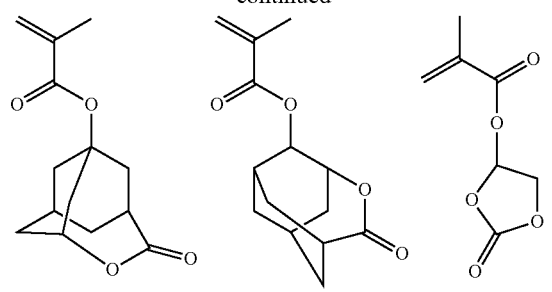
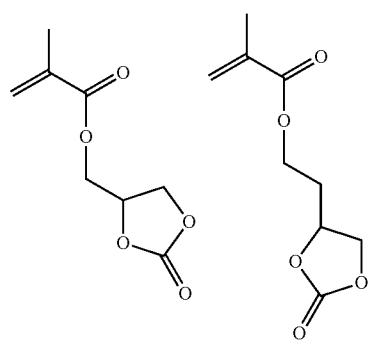
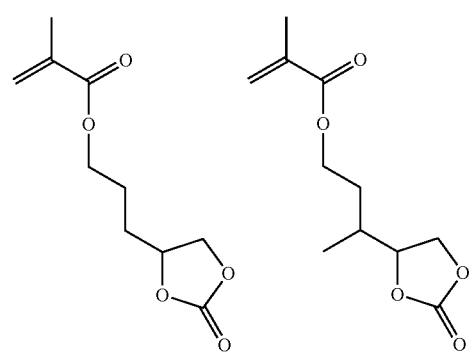
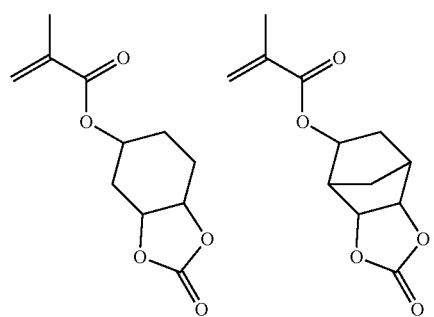
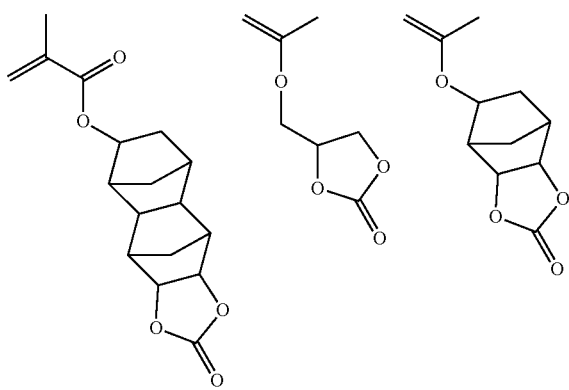
28
-continued
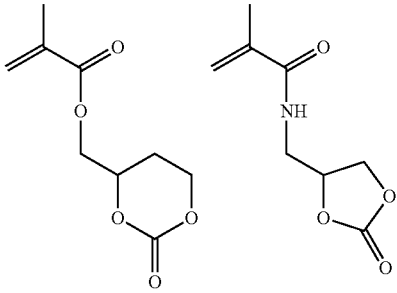
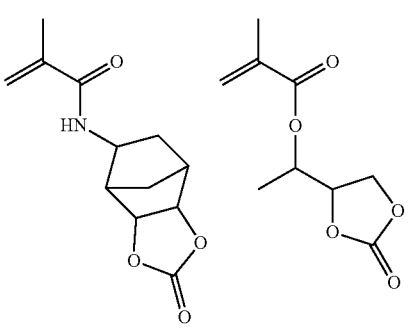
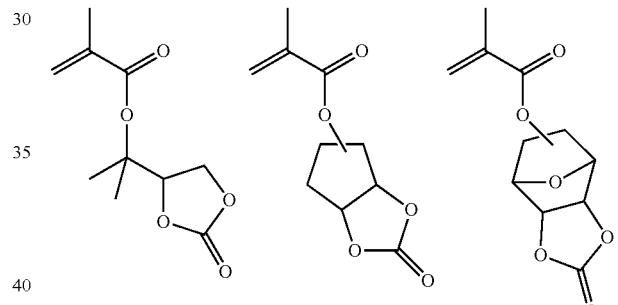
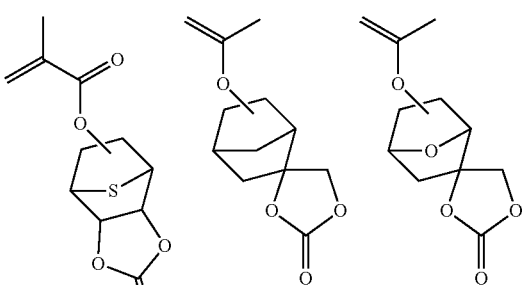
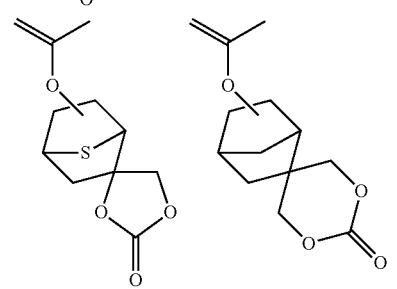

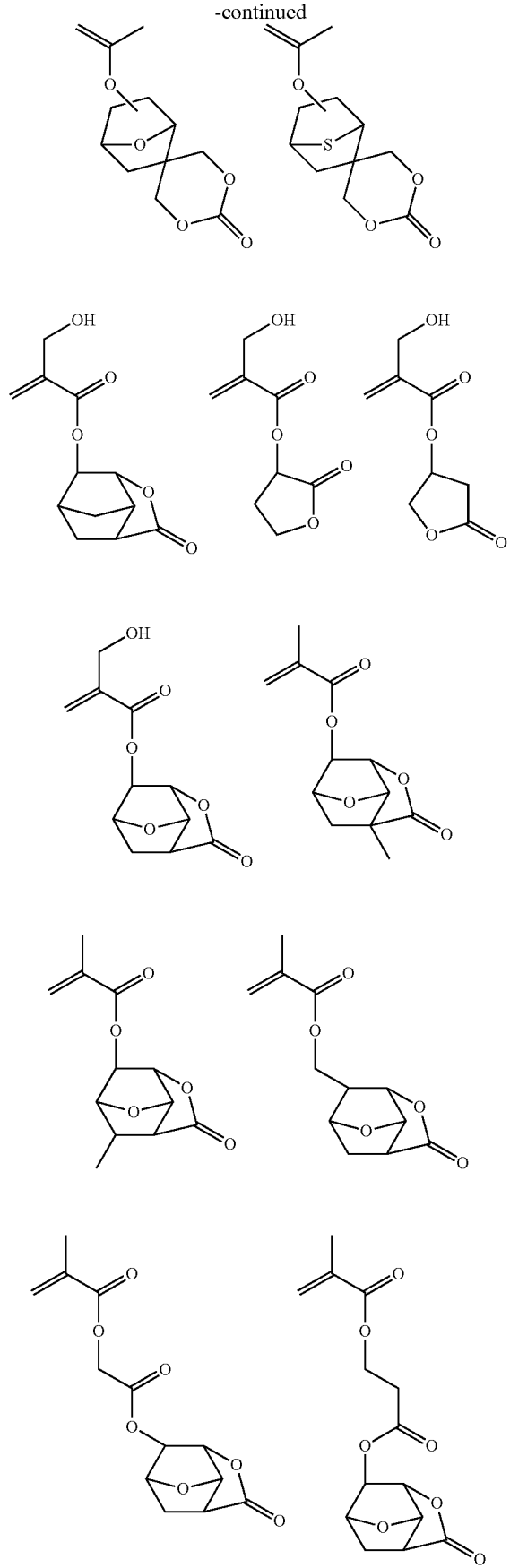
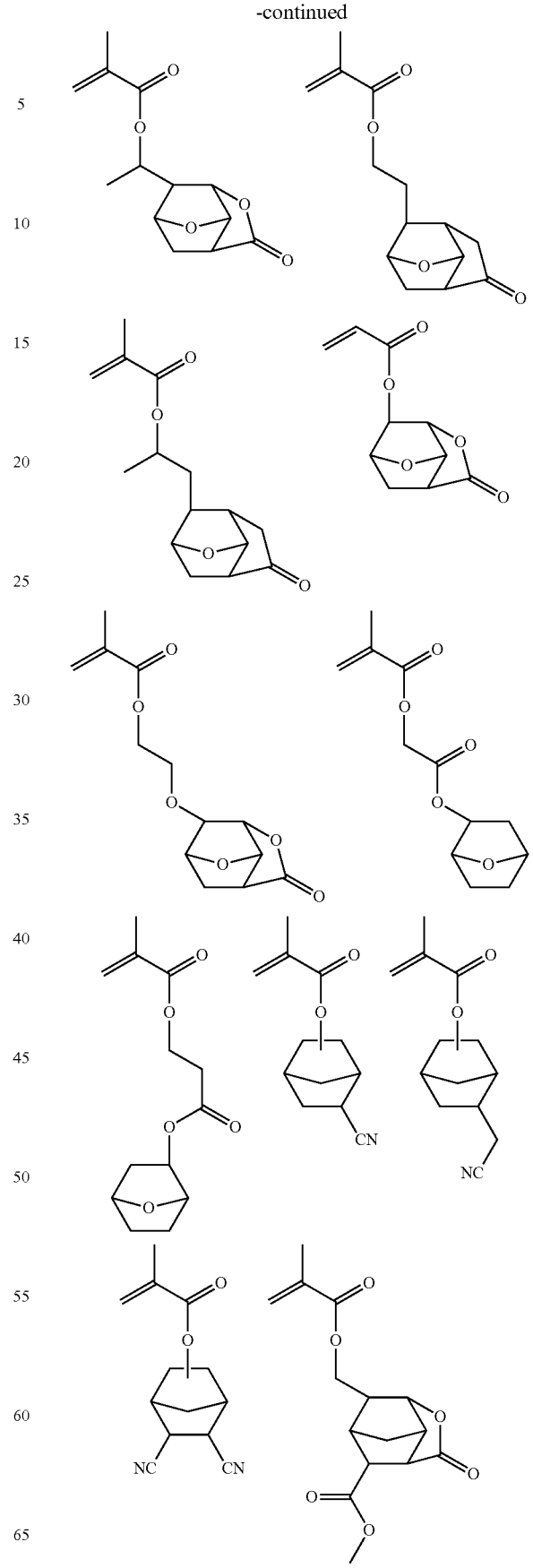

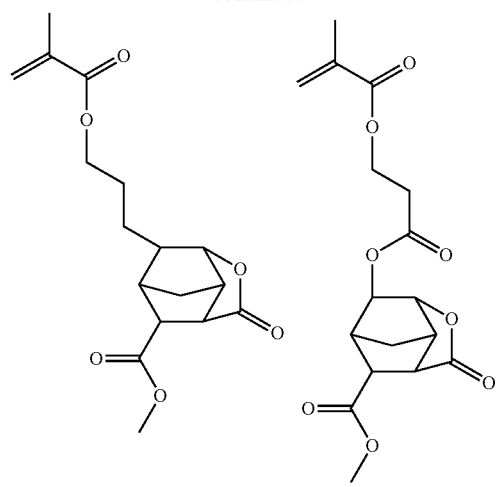
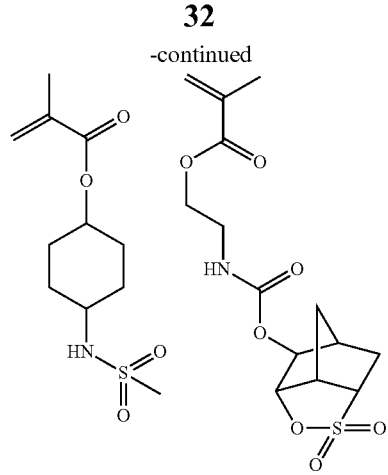
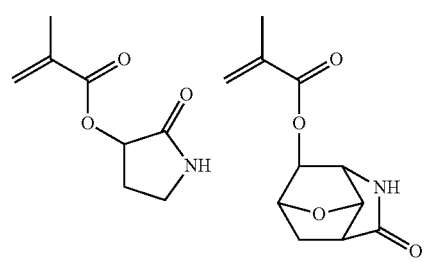
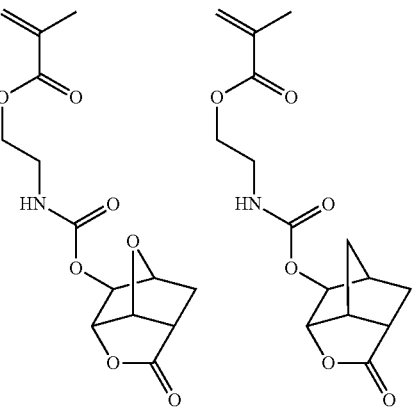
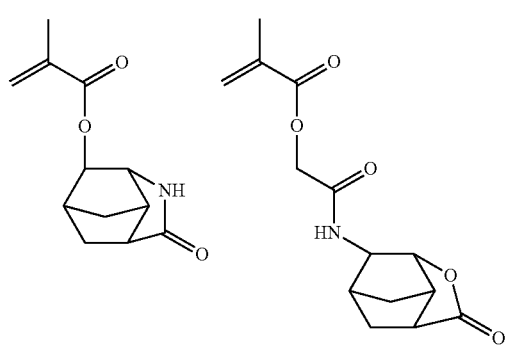
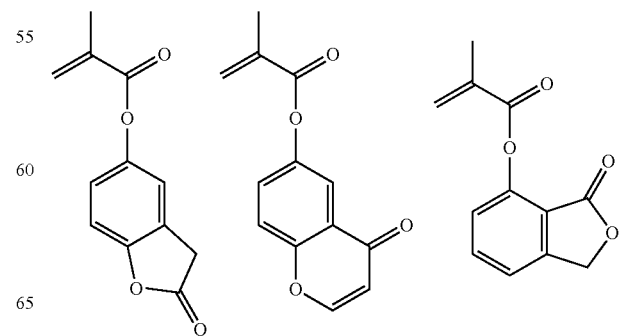

-continued
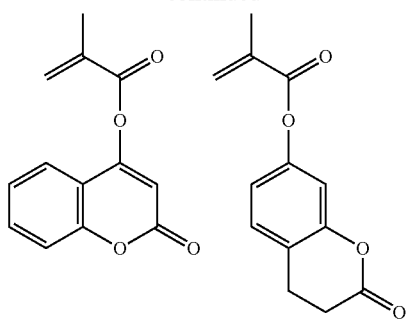
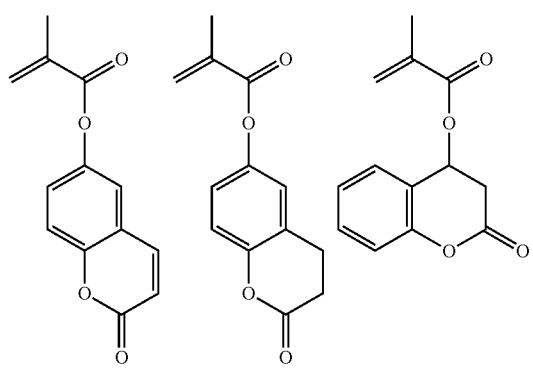
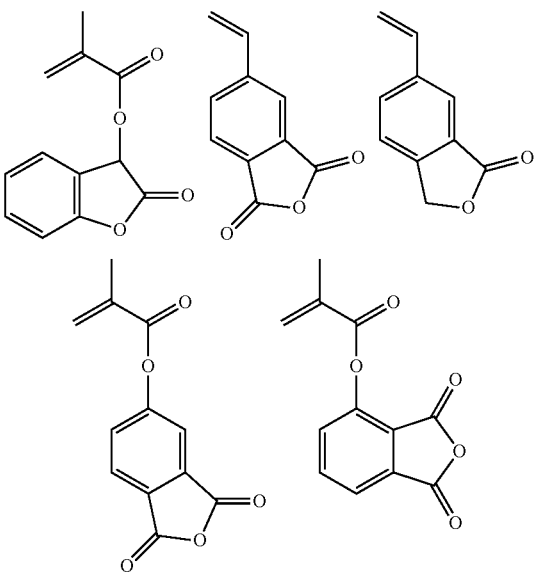
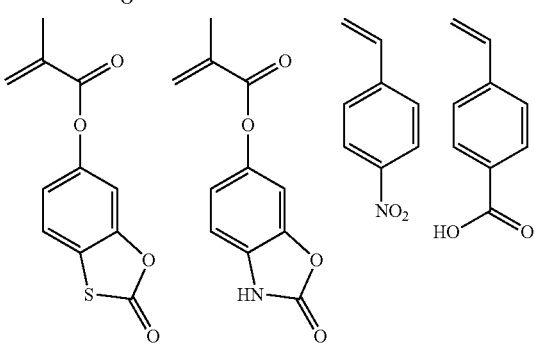
-continued
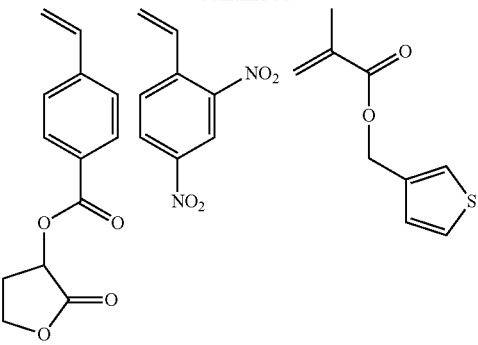
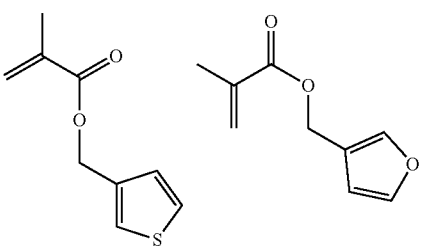
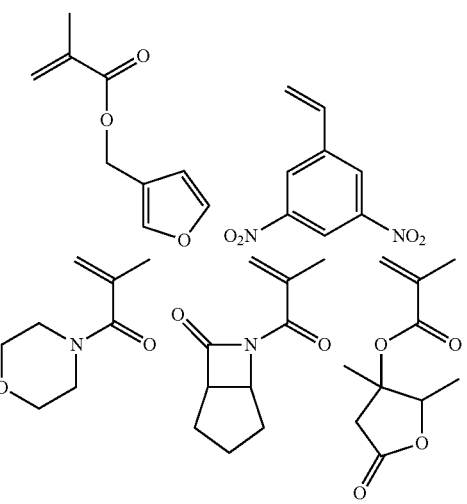

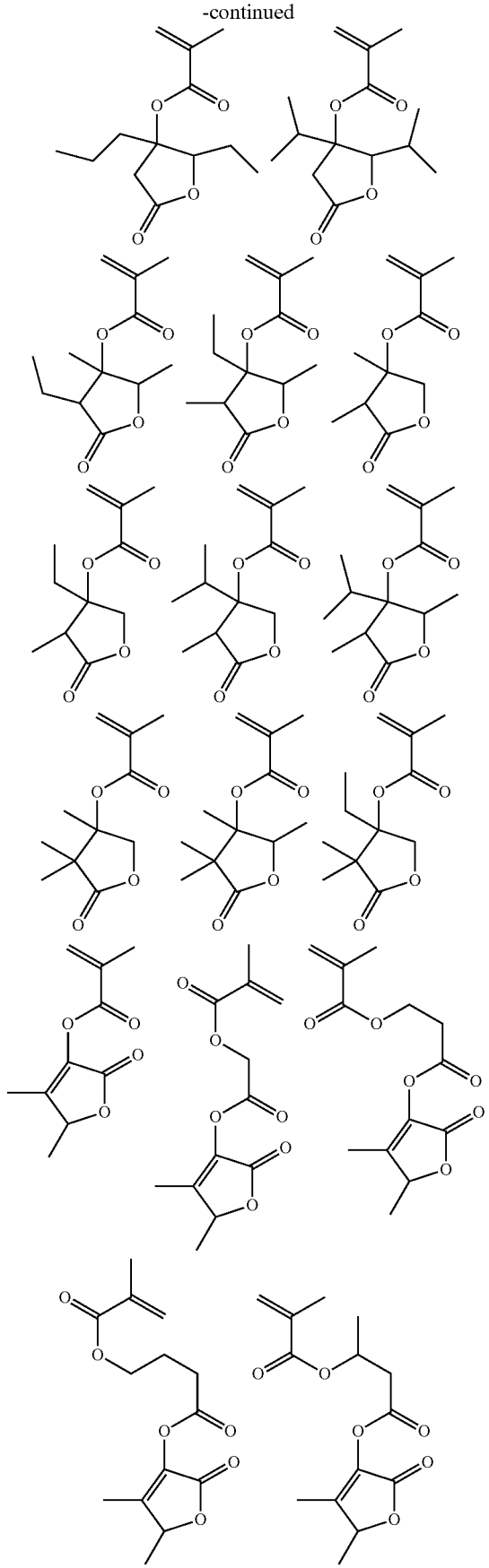
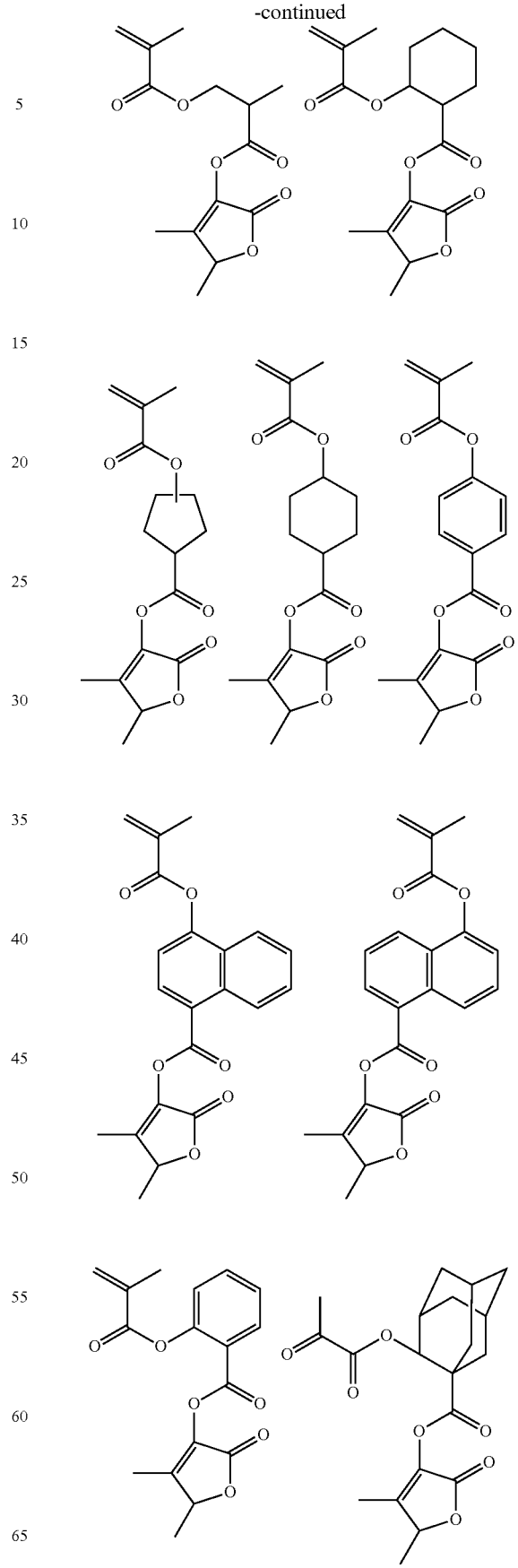

37
-continued
38
-continued
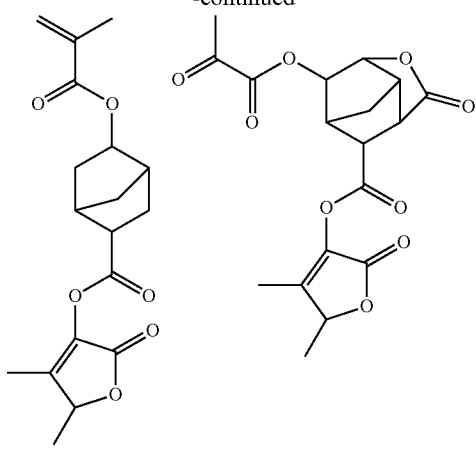
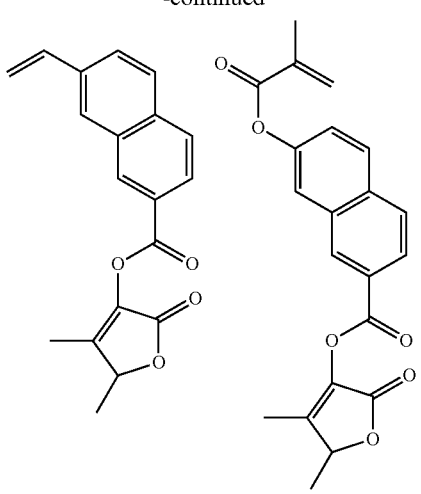
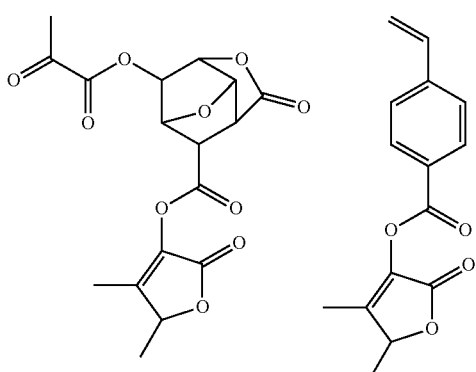
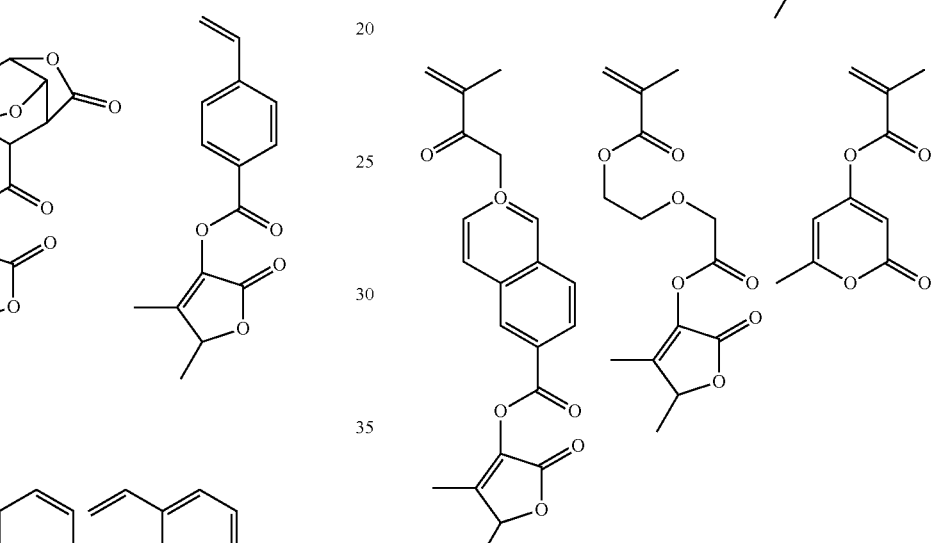
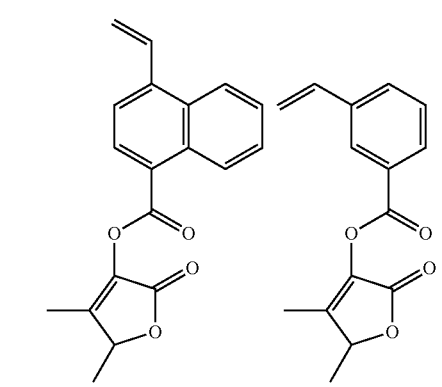
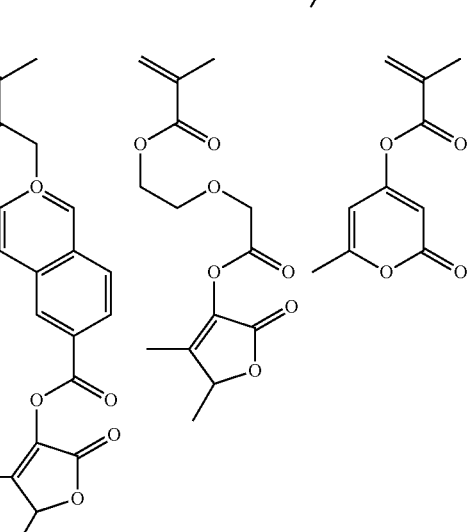
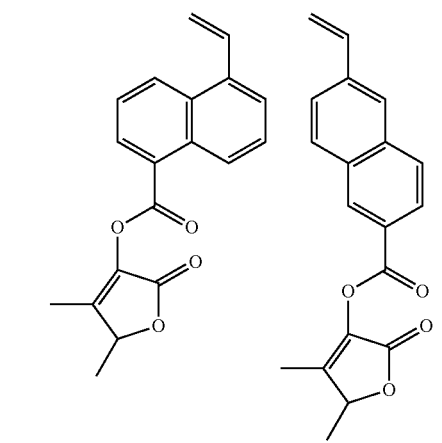
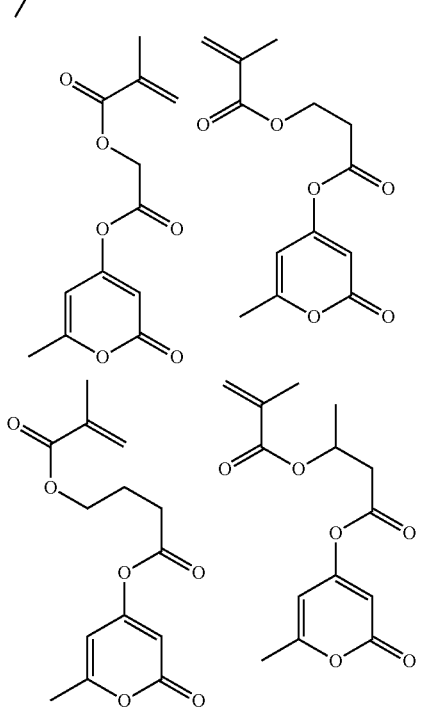

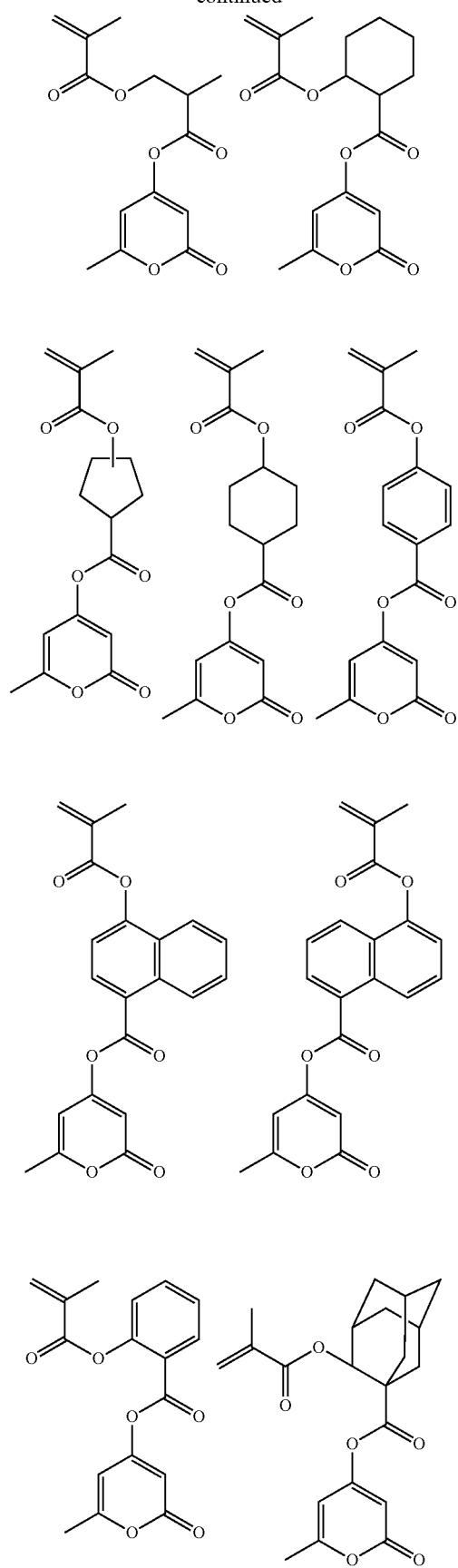
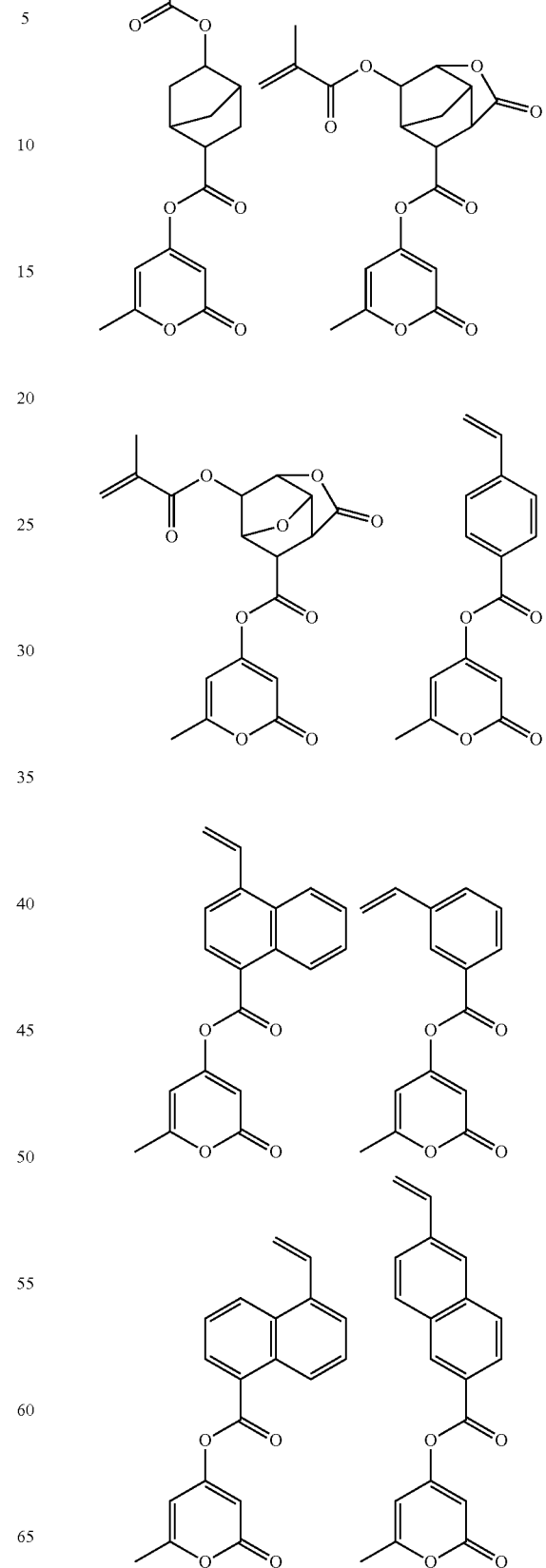

-continued

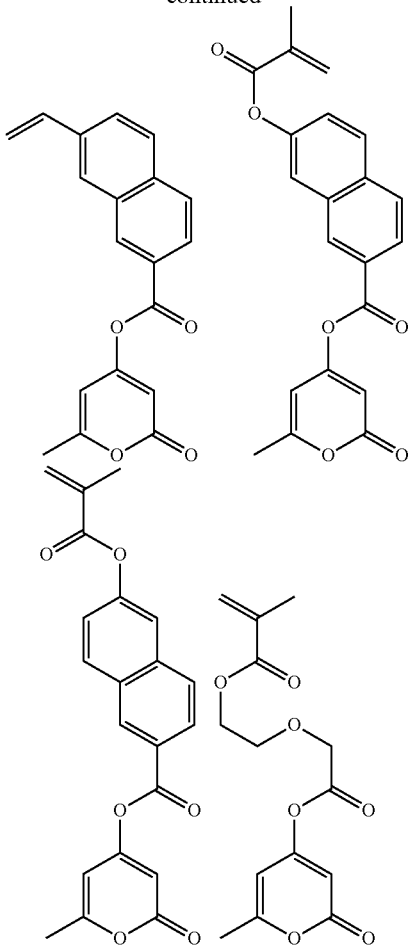

The base resin may further comprise recurring units (c) having a non-eliminatable hydrocarbon group. Suitable recurring units (c) include recurring units having a non-eliminatable hydrocarbon group as described in JP-A 2008-281980, and recurring units derived from indene, acenaphthylene, coumarin, norbornadiene, styrene, vinylnaphthalene, vinylanthracene, vinylpyrene, methyleneindane, vinylbiphenyl, and vinylcarbazole compounds as described in JP-A 2012-037867, paragraph [0085].

The base resin may further comprise recurring units (d) derived from an onium salt having a polymerizable unsaturated bond as described in JP-A 2012-037867, paragraphs [0089]-[0091].

The base resin should preferably have a weight average molecular weight (Mw) in the range of 2,000 to 50,000, and more preferably 3,000 to 40,000, as measured versus polystyrene standards by GPC using tetrahydrofuran (THF) solvent. A resin with Mw≥2,000 ensures suppressed acid diffusion and good resolution whereas a resin with Mw≤50,000 fully dissolves in developer.

If a base resin has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the base resin should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity may be used as the base resin.

The base resin may be synthesized by any desired method, for example, by dissolving a monomer providing recurring unit (a) and an optional monomer or monomers providing other recurring units in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the polymerization temperature is 50 to 80° C., and the reaction time is 2 to 100 hours, more preferably 5 to 20 hours.

The acid labile group that has been incorporated in the monomer may be kept as such. Alternatively, the acid labile group may be once eliminated with an acid catalyst and the polymerization be followed by protection or partial protection.

The resist composition contains the base resin defined above and an organic solvent, optionally an acid generator and quencher.

Examples of the organic solvent include, as described in U.S. Pat. No. 7,537,880 (JP-A 2008-111103, paragraphs [0144]-[0145]), ketones such as cyclohexanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; lactones such as γ-butyrolactone, and mixtures thereof. Where an acid labile group of acetal form is used, a high boiling alcohol solvent such as diethylene glycol, propylene glycol, glycerol, 1,4-butanediol or 1,3-butanediol may be added to accelerate deprotection reaction of acetal.

An appropriate amount of the organic solvent used is 100 to 10,000 parts, especially 300 to 8,000 parts by weight per 100 parts by weight of the base resin.

In a preferred embodiment, the resist composition contains an acid generator such that it may function as a chemically amplified resist composition. The acid generator is typically a compound capable of generating an acid in response to actinic light or radiation, known as photoacid generator (PAG). An appropriate amount of the PAG used is 0.5 to 30 parts, more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary of the acid generated by PAG are sulfonic acids, imidic acids and methide acids. Of these, sulfonic acids which are fluorinated at α-position are most commonly used. Where the acid labile group is an acetal group susceptible to deprotection, fluorination at α-position is not always necessary. Where the base resin has recurring units of acid generator copolymerized therein, the acid generator need not be separately added.

When added, an appropriate amount of the acid generator used is 0.5 to 100 parts, especially 1.0 to 50 parts by weight per 100 parts by weight of the base resin.

Suitable quenchers include primary, secondary and tertiary amine compounds, specifically amine compounds having a hydroxyl, ether, ester, lactone, cyano or sulfonate group, as described in JP-A 2008-111103, paragraphs [0146]-[0164], and compounds having a carbamate group, as described in JP 3790649.

Also, onium salts such as sulfonium salts, iodonium salts and ammonium salts of sulfonic acids which are not fluorinated at α-position as described in US 2008153030 (JP-A 2008-158339) and similar onium salts of carboxylic acid as described in JP 3991462 and JP 426803 may be used as the quencher.

When added, an appropriate amount of the quencher used is 0.0001 to 30 parts, especially 0.001 to 20 parts by weight per 100 parts by weight of the base resin.

If desired, the resist composition may further contain additives such as surfactants, dissolution regulators, acetylene alcohols, and water repellent improvers.

Exemplary surfactants are described in JP-A 2008-111103, paragraphs [0165]-[0166]. Exemplary dissolution regulators are described in JP-A 2008-122932 (US 2008090172), paragraphs [0155]-[0178], and exemplary acetylene alcohols in paragraphs [0179]-[0182]. The surfactant, dissolution regulator, and acetylene alcohol may be used in any suitable amounts, depending on their purpose of addition.

Also a water repellency improver may be added for improving the water repellency on surface of a resist film as spin coated. The water repellency improver may be used in the topcoatless immersion lithography. Suitable additives have a specific structure with a 1,1,1,3,3,3-hexafluoro-2-propanol residue and are described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

The resist composition is coated onto a substrate, which is generally a silicon substrate. The substrate may have a processable layer, hard mask or undercoat formed thereon. The processable layer includes $SiO_2$, SiN, SiON, SiOC, p-Si, α-Si, TiN, WSi, BPSG, SOG, Cr, CrO, CrON, MoSi, low dielectric film, and etch stopper film. The hard mask may be of $SiO_2$, SiN, SiON or p-Si. Sometimes, an undercoat in the form of carbon film or a silicon-containing intermediate film may be laid instead of the hard mask, and an organic antireflective coating may be interposed between the hard mask and the resist film.

A resist film of the resist composition is formed on the substrate directly or via an intermediate intervening layer as mentioned above. The resist film preferably has a thickness of 10 to 1,000 nm and more preferably 20 to 500 nm. Prior to exposure, the resist coating is prebaked, preferably at a temperature of 50 to 180° C., especially 60 to 150° C. for a time of 10 to 300 seconds, especially 15 to 200 seconds.

Next the resist film is exposed. For the exposure, preference is given to high-energy radiation having a wavelength of 140 to 250 nm, EUV of wavelength 13.5 nm, or EB, especially ArF excimer laser radiation of 193 nm. The exposure may be done either in a dry atmosphere such as air or nitrogen stream or by immersion lithography. The ArF immersion lithography uses deionized water or liquids having a refractive index of at least 1 and highly transparent to the exposure wavelength such as alkanes as the immersion solvent. In the immersion lithography, the prebaked resist film is exposed to light through a projection lens, with pure water or another liquid introduced between the resist film and the projection lens. Since this allows lenses to be designed to a NA of 1.0 or higher, formation of finer feature size patterns is possible. The immersion lithography is important for the ArF lithography to survive to the 45-nm node.

In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3, 3-hexafluoro-2-propanol residues which is insoluble in water, but soluble in an alkaline developer liquid, in a solvent selected from alcohols of 4 to 10 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably performed in an exposure dose of about 1 to 200 $mJ/cm^2$, more preferably about 10 to 100 $mJ/cm^2$.

This is followed by baking (PEB) in a high-humidity environment having a water content of at least 10 g per kilogram of dry air. The environment having a water content of 10 g per kilogram of dry air corresponds to an environment having a relative humidity of 60% at 23° C. The water content per kilogram of dry air is preferably at least 15 g, more preferably at least 20 g, and even more preferably at least 25 g.

The temperature of the high-humidity environment is not particularly limited as long as the relative humidity is equal to or less than 100%. Preferably the temperature is such as to give a relative humidity of at least 50%, more preferably at least 70%.

In a preferred embodiment, PEB in the high-humidity environment is carried out on a hot plate. Specifically PEB is carried out in the high-humidity environment on a hot plate, preferably at 50 to 150° C. for 1 to 5 minutes, more preferably at 60 to 120° C. for 1 to 3 minutes.

In another preferred embodiment, PEB is carried out by spraying hot humid steam to the resist film. For example, PEB is carried out by spraying hot steam of controlled temperature and humidity to the resist film. Since the resist film is heated by steam, it is not essential to heat the substrate.

There is a tendency that as the percent shrinkage of resist film after PEB is lower, the percent deformation of an isolated trench pattern becomes reduced. Non-Patent Document 2 describes that when the percent shrinkage of resist film after PEB is 15%, an isolated trench pattern is deformed. It is thus preferred that the percent shrinkage of resist film after PEB be less than 15%, more preferably up to 12%, and even more preferably up to 10%.

Thereafter the exposed resist film is developed in a developer consisting of an organic solvent for 0.1 to 3 minutes, preferably 0.5 to 2 minutes by any conventional techniques such as dip, puddle and spray techniques. In this way, a negative tone resist pattern is formed on the substrate. The developer consists of at least one organic solvent selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, which may be used alone or in admixture.

At the end of development, the resist film may be rinsed. As the rinsing liquid, a solvent which is miscible with the developer and does not dissolve the resist film is preferred. Suitable solvents include alkanes, alkenes, and alkynes of 6 to 12 carbon atoms, alcohols of 3 to 10 carbon atoms, ether compounds of 8 to 12 carbon atoms, and aromatic solvents. Specifically, suitable alkanes of 6 to 12 carbon atoms include hexane, heptane, octane, nonane, decane, undecane, dodecane, methylcyolopentane, dimethylcyclopentane, cyclohexane, methylcyclohexane, dimethylcyclohexane, cycloheptane, cyclooctane, and cyclooctane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable aromatic solvents include toluene, xylene, ethylbenzene, isopropylbenzene, t-butylbenzene, and mesitylene. The solvents may be used alone or in admixture.

After the rinse liquid is applied, the substrate may be dried by spin drying and bake. However, rinsing is not essential. As long as the step of spin drying the substrate after the developer is applied thereto is included, the rinsing step may be omitted.

EXAMPLE

Examples of the invention are given below by way of Illustration and not by way of limitation. The abbreviation "pbw" is parts by weight. For all polymers, Mw and Mn are determined versus polystyrene standards by GPC using THF solvent.

1. Preparation of Resist Composition

A resist composition in solution form was prepared by dissolving a resist polymer, water-repellent polymer, sulfonium salt, and amine quencher in a solvent in accordance with the formulation of Table 1, and filtering through a Teflon® filter with a pore size of 0.2 µm. The solvent contained 100 ppm of surfactant FC-4430 (3M-Sumitomo Co., Ltd.). The components used herein are shown below.

Resist Polymer 1

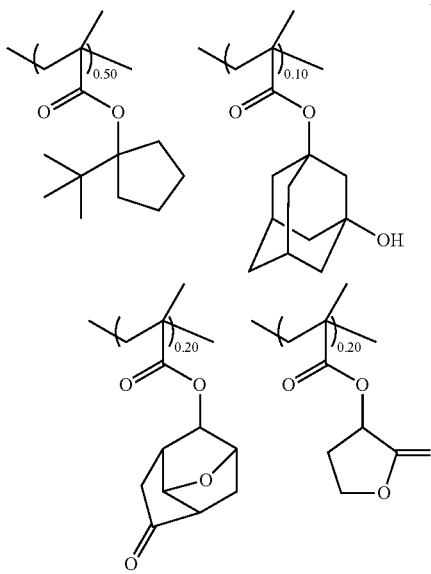

Mw = 7,500
Mw/Mn = 1.61

Resist Polymer 2

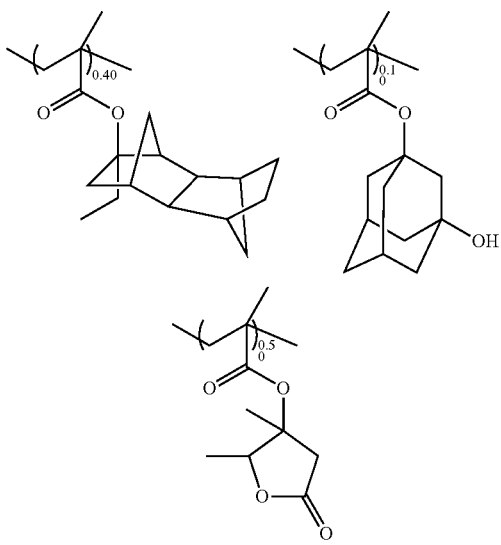

Mw = 9,600
Mw/Mn = 1.59

-continued

Water-Repellent Polymer 1

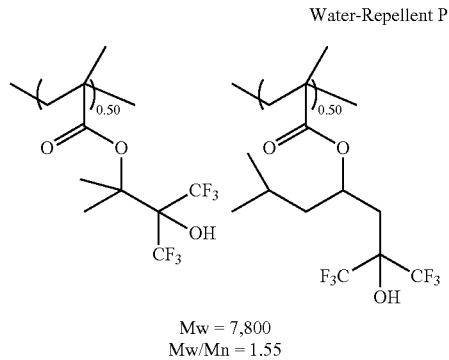

Water-Repellent Polymer 1

Mw = 7,800
Mw/Mn = 1.55

Water-Repellent Polymer 2

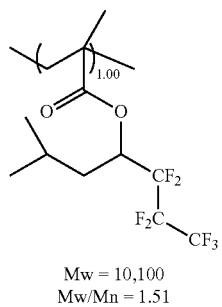

Water-Repellent Polymer 2

Mw = 10,100
Mw/Mn = 1.51

Acid generator: PAG1 and PAG2

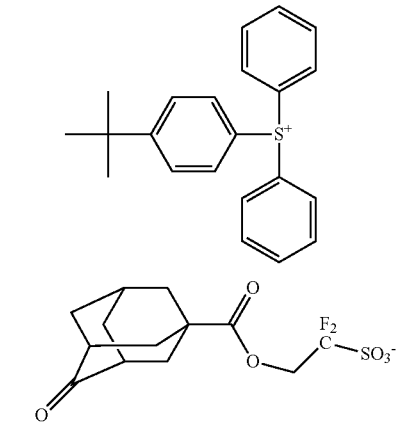

PAG 1

PAG 2

-continued

Sulfonium salts 1 snd 2, Amine quenchers 1 and 2

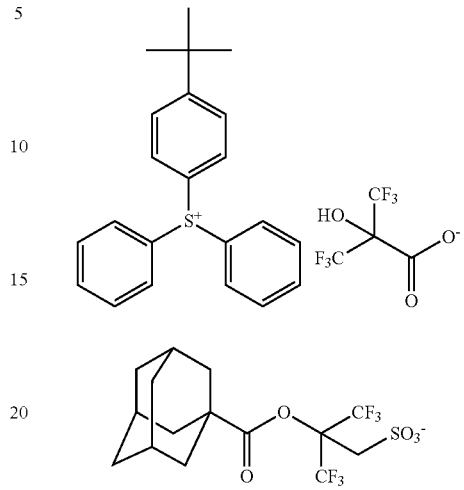

Sulfonium salt 1

Sulfonium salt 2

Amine quencher 1

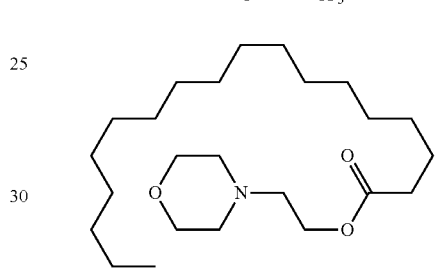

Amine quencher 2

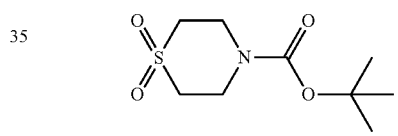

Solvent: propylene glycol monomethyl ether acetate (PGMEA)

TABLE 1

| Resist | Polymer (pbw) | Acid generator (pbw) | Quencher (pbw) | Water repellent (pbw) | Organic solvent (pbw) |
|---|---|---|---|---|---|
| Resist 1 | Resist Polymer 1 (100) | PAG 1 (10.0) | Amine quencher 1 (2.0) | Water-repellent polymer 1 (3.0) | PGMEA (2,500) γ-butyrolactone (200) |
| Resist 2 | Resist Polymer 2 (100) | PAG 2 (8.0) | Sulfonium salt 1 (4.0) | Water-repellent polymer 2 (3.0) | PGMEA (2,500) γ-butyrolactone (200) |
| Resist 3 | Resist Polymer 2 (100) | PAG 2 (8.0) | Sulfonium salt 2 (4.0) | Water-repellent polymer 2 (3.0) | PGMEA (2,500) γ-butyrolactone (200) |
| Resist 4 | Resist Polymer 2 (100) | PAG 2 (8.0) | Sulfonium salt 1 (2.0) Amine quencher 2 (1.0) | Water-repellent polymer 2 (3.0) | PGMEA (2,500) γ-butyrolactone (200) |

2. ArF Lithography Patterning Test

Examples 1-1 to 1-4 & Comparative Examples 1-1 to 1-2

On a silicon wafer having an antireflective coating ARC-29A (Nissan Chemical Industries, Ltd.) deposited to a thickness of 80 nm, the resist composition in Table 1 was coated and prebaked at 80° C. for 60 seconds to form a resist film of 100 nm thick. Using an ArF excimer laser lithography scanner NSR-307E (Nikon Corp., NA 0.85, σ 0.93, conventional illumination), the resist film was subjected to open-frame exposure at a varying exposure dose. Thereafter, the resist film was baked (PEB) under the conditions shown in Table 2. PEB was carried out while humidity-controlled air was fed at a flow rate of 2 L/min onto a manual hot plate in a closed chamber, using a precise humid air supply system SRC-1R-AS (Daiichi Kagaku Inc.) for humidity control.

The thickness (a) of the resist film prior to the exposure and the thickness (b) of the resist film after the PEB were measured by an optical film thickness gauge. A percent shrinkage was computed as $\{(a-b)/a\} \times 100$. The results are shown in Table 2.

TABLE 2

| | | Resist | PEB conditions | Shrinkage (%) |
|---|---|---|---|---|
| Example | 1-1 | Resist 1 | 25 g/kg of dry air, temp. 40° C. (RH 50%) 90° C., 90 sec | 12 |
| | 1-2 | Resist 2 | 40 g/kg of dry air, temp. 40° C. (RH 85%) 95° C., 90 sec | 9 |
| | 1-3 | Resist 3 | 29 g/kg of dry air, temp. 30° C. (RH 100%) 95° C., 90 sec | 8 |
| | 1-4 | Resist 4 | 29 g/kg of dry air, temp. 30° C. (RH 100%) 95° C., 90 sec | 8 |
| Comparative Example | 1-1 | Resist 1 | 5 g/kg of dry air, temp. 40° C. (RH 10%) 90° C., 90 sec | 20 |
| | 1-2 | Resist 2 | 5 g/kg of dry air, temp. 40° C. (RH 10%) 95° C., 90 sec | 18 |

3. ArF Lithography Patterning Test

Examples 2-1 to 2-4 & Comparative Examples 2-1 to 2-2

On a silicon wafer, a spin-on carbon film ODL-102 (Shin-Etsu Chemical Co., Ltd.) was deposited to a thickness of 200 nm and a silicon-containing spin-on hard mask SHB-A940 was deposited thereon to a thickness of 35 nm. On this substrate for trilayer process, the resist composition in Table 1 was spin coated and prebaked on a hot plate at 80° C. for 60 seconds to form a resist film of 100 nm thick. Using an ArF excimer laser immersion lithography scanner NSR-610C (Nikon Corp., NA 1.30, σ 0.98/0.78, cross-pole opening 35 deg., azimuthally polarized illumination), the resist film was exposed through a 6% halftone phase shift mask while varying the exposure dose. After the exposure, the resist film was baked (PEB) under the conditions of Table 3 for 90 seconds and puddle developed in n-butyl acetate for 30 seconds to form an isolated trench pattern having a size of 100 nm and a pitch of 300 nm. A cross section of the trench pattern was observed under SEM. The results are shown in Table 3.

TABLE 3

| | | Resist | PEB conditions | Pattern profile after development |
|---|---|---|---|---|
| Example | 2-1 | Resist 1 | 25 g/kg of dry air, temp. 40° C. (RH 50%) 90° C., 90 sec | perpendicular |
| | 2-2 | Resist 2 | 40 g/kg of dry air, temp. 40° C. (RH 85%) 95° C., 90 sec | perpendicular |
| | 2-3 | Resist 3 | 29 g/kg of dry air, temp. 30° C. (RH 100%) 95° C., 90 sec | perpendicular |
| | 2-4 | Resist 4 | 29 g/kg of dry air, temp. 30° C. (RH 100%) 95° C., 90 sec | perpendicular |
| Comparative Example | 2-1 | Resist 1 | 5 g/kg of dry air, temp. 40° C. (RH 10%) 90° C., 90 sec | tapered |
| | 2-2 | Resist 2 | 5 g/kg of dry air, temp. 40° C. (RH 10%) 95° C., 90 sec | tapered |

It is noted that the invention is not limited to the aforementioned embodiments. While the embodiments are merely exemplary, any embodiments having substantially the same construction as the technical concept set forth in the following claims and exerting equivalent functions and results are believed to be within the spirit and scope of the invention.

Japanese Patent Application No. 2015-136629 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
    coating a resist composition comprising a base resin comprising recurring units having an acid labile group-substituted carboxyl group and an organic solvent onto a substrate,
    prebaking the composition to form a resist film,
    exposing the resist film to high-energy radiation,
    post-exposure baking the resist film in a high-humidity environment having a water content of at least 10 g per kilogram of dry air, and
    developing the resist film in an organic solvent developer to form a negative pattern.

2. The process of claim 1 wherein the PEB step includes heating on a hot plate.

3. The process of claim 1 wherein the PEB step includes spraying hot humid steam.

4. The process of claim 1 wherein the recurring units having an acid labile group-substituted carboxyl group have the formula (1):

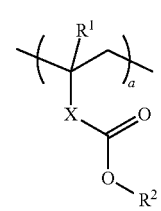

(1)

wherein $R^1$ is hydrogen or methyl, $R^2$ is an acid labile group of tertiary alkyl type, X is a single bond or —C(=O)—O—$R^3$—, $R^3$ is a straight, branched or cyclic $C_1$-$C_{10}$ alkylene group which may contain an ether or ester bond, or phenylene or naphthylene group, and a is a positive number in the range: 0<a≤1.0.

5. The process of claim 1 wherein the resist composition further comprises an acid generator.

6. The process of claim 1 wherein the resist film has a s thickness of 10 to 1,000 nm.

7. The process of claim 6 wherein a film thickness loss between the thickness of the resist film prior to the PEB step and the thickness of the resist film after the PEB step is less than 15% of the thickness of the resist film prior to the PEB step.

8. The process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

9. The process of claim 1 wherein the exposing step includes lithography using KrF excimer laser of wavelength 248 nm, ArF excimer laser of wavelength 193 nm, EUV of wavelength 13.5 nm or EB.

10. The process of claim 9 wherein the exposing step is performed by immersion lithography, with a liquid having a refractive index of at least 1 being interposed between the resist film and a projection lens.

\* \* \* \* \*